United States Patent
Nishiwaki

(10) Patent No.: US 12,401,356 B2
(45) Date of Patent: Aug. 26, 2025

(54) SEMICONDUCTOR DEVICE AND CONTROL CIRCUIT THEREOF

(71) Applicants: Kabushiki Kaisha Toshiba, Tokyo (JP); Toshiba Electronic Devices & Storage Corporation, Tokyo (JP)

(72) Inventor: Tatsuya Nishiwaki, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 95 days.

(21) Appl. No.: 18/463,224

(22) Filed: Sep. 7, 2023

(65) Prior Publication Data
US 2024/0322809 A1    Sep. 26, 2024

(30) Foreign Application Priority Data
Mar. 22, 2023   (JP) .................... 2023-045905

(51) Int. Cl.
H03K 17/0412   (2006.01)

(52) U.S. Cl.
CPC .......... *H03K 17/04123* (2013.01); *H03K 2217/0036* (2013.01)

(58) Field of Classification Search
CPC .... H03K 17/04123; H03K 2217/0036; H02M 1/088; H02M 1/0058
See application file for complete search history.

(56) References Cited

U.S. PATENT DOCUMENTS

| | | | |
|---|---|---|---|
| 7,408,223 B2 | 8/2008 | Hueting | |
| 11,387,231 B2 | 7/2022 | Shimizu et al. | |
| 2021/0288177 A1 | 9/2021 | Nishiwaki et al. | |
| 2024/0259018 A1* | 8/2024 | Kinoshita | H03K 17/081 |

FOREIGN PATENT DOCUMENTS

| | | |
|---|---|---|
| JP | 2007-512699 A | 5/2007 |
| JP | 4610941 B2 | 1/2011 |
| JP | 2021-082630 A | 5/2021 |
| JP | 2021-145122 A | 9/2021 |

OTHER PUBLICATIONS

Nishiwaki et al. "Gate drive techniques of Gate-connected Trench Field Plate Power MOSFETs to reduce both switching and conduction losses," 2021 33rd International Symposium on Power Semiconductor Devices and ICs (ISPSD), Nagoya Japan, 2021, pp. 155-158.

* cited by examiner

*Primary Examiner* — Metasebia T Retebo
(74) *Attorney, Agent, or Firm* — Kim & Stewart LLP

(57) ABSTRACT

According to one embodiment, a control circuit includes a first bias terminal, a second bias terminal, an input-side terminal, a diode, a capacitor, a first transistor, a second transistor, and an output-side terminal. The first transistor includes a first control terminal configured to turn on and off electrical conduction between a third terminal and a fourth terminal. The second transistor includes a second control terminal configured to turn on and off electrical conduction between a fifth terminal and a sixth terminal. A control signal based on a signal input to the input-side terminal is input to the first control terminal and the second control terminal, and the first transistor and the second transistor are alternately turned on and alternately turned off.

9 Claims, 18 Drawing Sheets

SEMICONDUCTOR DEVICE AND CONTROL CIRCUIT THEREOF

CROSS-REFERENCE TO RELATED APPLICATIONS

This application is based upon and claims the benefit of priority from Japanese Patent Application No. 2023-045905, filed on Mar. 22, 2023; the entire contents of which are incorporated herein by reference.

FIELD

Embodiments relate to a semiconductor device and a control circuit thereof.

BACKGROUND

A semiconductor device such as a MOS transistor is required to reduce on-resistance (conduction loss) and switching loss.

DETAILED DESCRIPTION

Figure 1:
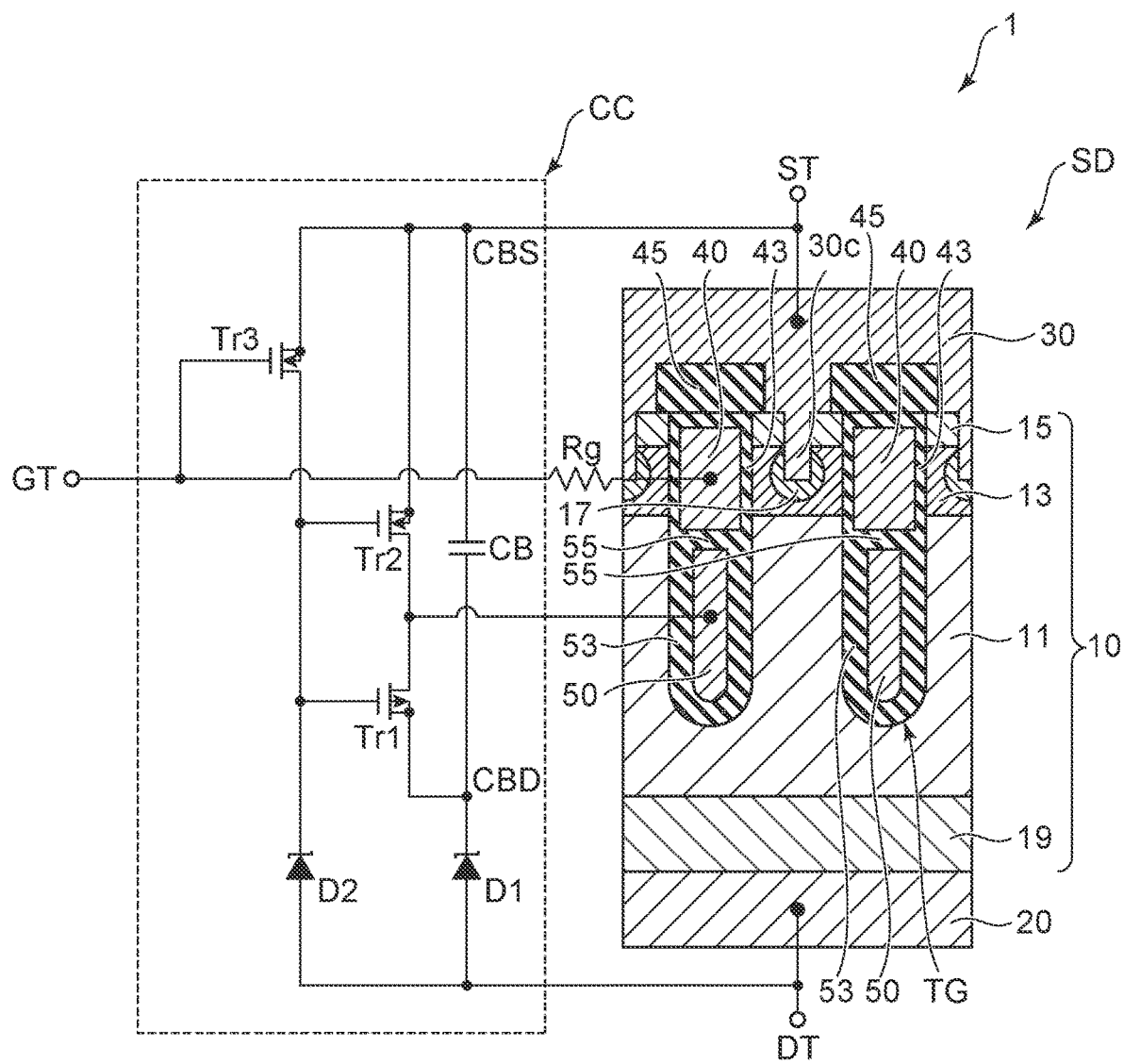
FIG. 1 is a schematic view showing a semiconductor device according to a first embodiment.

In general, according to one embodiment, a control circuit includes a first bias terminal, a second bias terminal separated from the first bias terminal, an input-side terminal separated from the first bias terminal and the second bias terminal, a diode having an anode connected to the first bias terminal, a capacitor including a first terminal connected to a cathode of the diode and a second terminal electrically connected to the second bias terminal, a first transistor including a third terminal connected to the first terminal of the capacitor, a fourth terminal, and a first control terminal configured to turn on and off electrical conduction between the third terminal and the fourth terminal, a second transistor including a fifth terminal connected to the fourth terminal of the first transistor, a sixth terminal connected to the second bias terminal, and a second control terminal configured to turn on and off electrical conduction between the fifth terminal and the sixth terminal, and an output-side terminal separated from the first bias terminal, the second bias terminal, and the input-side terminal and connected to the fourth terminal of the first transistor and the fifth terminal of the second transistor. a control signal based on a signal input to the input-side terminal being input to the first control terminal and the second control terminal, and the first transistor and the second transistor being alternately turned on and alternately turned off.

Hereinafter, embodiments will be described with reference to the drawings. The detailed description of the same portion in the drawings attached with the same reference sign will be omitted as appropriate, and a different portion will be described. The drawings are schematic or conceptual. A relationship between a thickness and a width of each portion, a ratio of sizes between portions, and the like are not necessarily the same as the actual ones. Even if same portions are shown, dimensions and ratios may be shown differently from each other in the drawings.

Next, an arrangement and a configuration of each part will be described using an X axis, a Y axis, and a Z axis shown in drawings. The X axis, the Y axis, and the Z axis are orthogonal to one another and represent an X-direction, a Y-direction, and a Z-direction, respectively. The Z-direction may be described as an upper side, and an opposite direction of the Z-direction may be described as a lower side.

First Embodiment

FIG. 1 is a schematic view showing a semiconductor device 1 according to a first embodiment. The semiconductor device 1 includes, for example, a switching element SD and a control circuit CC. The switching element SD is, for example, a power MOS transistor having a trench gate structure.

As shown in FIG. 1, the switching element SD includes, for example, a semiconductor portion 10, a first electrode 20, a second electrode 30, control electrodes 40, and third electrodes 50. The semiconductor portion 10 is located between the first electrode 20 and the second electrode 30. For example, the second electrode 30 faces the first electrode 20 with the semiconductor portion 10 interposed therebetween.

For example, the first electrode 20 is provided on a back surface of the semiconductor portion 10. The first electrode 20 is, for example, a drain electrode. For example, the second electrode 30 is provided on an opposite-side surface from the back surface of the semiconductor portion 10. The second electrode 30 is, for example, a source electrode.

The semiconductor portion 10 includes a first conductivity type first semiconductor layer 11, a second conductivity type second semiconductor layer 13, a first conductivity type third semiconductor layer 15, a second conductivity type fourth semiconductor layer 17, and a first conductivity type fifth semiconductor layer 19. Hereinafter, the first conductivity type will be described as an n-type, and the second conductivity type will be described as a p-type. However, the embodiment is not limited thereto.

The first semiconductor layer 11 extends between the first electrode 20 and the second electrode 30. The first semiconductor layer 11 is, for example, an n-type drift layer. The second semiconductor layer 13 is provided between the first semiconductor layer 11 and the second electrode 30. The second semiconductor layer 13 is, for example, a p-type body layer.

The third semiconductor layer 15 is provided between the second semiconductor layer 13 and the second electrode 30. The third semiconductor layer 15 is, for example, an n-type source layer. For example, the third semiconductor layer 15 is in contact with and electrically connected to the second electrode 30.

The fourth semiconductor layer 17 is provided between the second semiconductor layer 13 and the second electrode 30 and is at least partially located in the second semiconductor layer 13. The fourth semiconductor layer 17 is, for example, a p-type contact layer. The fourth semiconductor layer 17 contains a second conductivity type impurity having a concentration higher than a concentration of a second conductivity type impurity in the second semiconductor layer 13. The second electrode 30 includes, for example, a contact portion 30c that is in contact with and electrically connected to the fourth semiconductor layer 17. The second electrode 30 is electrically connected to the second semiconductor layer 13 via the fourth semiconductor layer 17.

The fifth semiconductor layer 19 is provided between the first semiconductor layer 11 and the first electrode 20. The fifth semiconductor layer 19 is, for example, an n-type buffer layer. The fifth semiconductor layer 19 contains an n-type impurity having a concentration higher than a concentration of an n-type impurity in the first semiconductor layer 11. For example, the first electrode 20 is in contact with and electrically connected to the fifth semiconductor layer 19.

The semiconductor portion 10 has a trench TG provided on a surface side thereof. The control electrodes 40 and the third electrodes 50 are provided inside the trench TG. The control electrodes 40 are located between the second electrode 30 and the third electrodes 50. The third electrodes 50 are located between the first electrode 20 and the control electrodes 40.

The control electrode 40 is, for example, a gate electrode. The control electrodes 40 are provided at positions facing the second semiconductor layer 13 via first insulating films 43. The first insulating film 43 is, for example, a gate insulating film. The control electrodes 40 face the first semiconductor layer 11 via the first insulating films 43. The control electrodes 40 also face the third semiconductor layer 15 via the first insulating films 43. In other words, the first insulating film 43 electrically insulates the control electrode 40 from the semiconductor portion 10.

Further, second insulating films 45 are provided between the second electrode 30 and the control electrodes 40. The second insulating film 45 is, for example, an interlayer insulating film. The second insulating film 45 electrically insulates the control electrode 40 from the second electrode 30.

The third electrode 50 is, for example, a field plate. The third electrodes 50 are located in the first semiconductor layer 11. The third electrodes 50 face the first semiconductor layer 11 via third insulating films 53. The third insulating film 53 is, for example, a field plate insulating film (an FP insulating film). The third insulating films 53 electrically insulate the third electrodes 50 from the first semiconductor layer 11. Fourth insulating films 55 are provided between the control electrodes 40 and the third electrodes 50. The fourth insulating films 55 electrically insulate the control electrodes 40 from the third electrodes 50.

As shown in FIG. 1, the semiconductor device 1 further includes a first terminal DT, a second terminal ST, and a control terminal GT. The first terminal DT, the second terminal ST, and the control terminal GT are connected to the switching element SD and the control circuit CC.

The first terminal DT is, for example, a drain terminal. The first terminal DT is connected to the first electrode 20 of the switching element SD. The second terminal ST is, for example, a source terminal. The second terminal ST is connected to the second electrode 30 of the switching element SD. The control terminal GT is, for example, a gate terminal. The control terminal GT is electrically connected to, for example, the control electrode 40 of the switching element SD. The control terminal GT is electrically connected to the control electrode 40 via, for example, a gate resistor Rg. The gate resistor Rg is, for example, an internal resistor of the control electrode 40.

For example, the control circuit CC is electrically connected to the first terminal DT, the second terminal ST, the control terminal GT, and the third electrode 50 of the switching element SD. The control circuit CC applies a field plate voltage VFP between the second electrode 30 and the third electrode 50.

The control circuit CC includes, for example, a first transistor Tr1, a second transistor Tr2, a third transistor Tr3, a first diode D1, a second diode D2, and a capacitor CB. The first transistor Tr1 is, for example, a PMOS transistor. The second transistor Tr2 and the third transistor Tr3 are, for example, NMOS transistors.

The first diode D1 and the capacitor CB are connected in series between the first terminal DT and the second terminal ST. An anode of the first diode D1 is connected to the first terminal DT, and a cathode of the first diode D1 is connected to one terminal CBD of the capacitor CB. The other terminal CBS of the capacitor CB is connected to the second terminal ST.

The first transistor Tr1 and the second transistor Tr2 are connected in series, and a drain of the first transistor Tr1 is connected to a drain of the second transistor Tr2. A source of the first transistor Tr1 is connected to the cathode of the first diode D1 and the terminal CBD of the capacitor CB. A source of the second transistor Tr2 is connected to the second terminal ST.

The second diode D2 and the third transistor Tr3 are connected in series between the first terminal DT and the second terminal ST. An anode of the second diode D2 is connected to the first terminal DT, and the cathode of the second diode D1 is connected to a drain of the third transistor Tr3. A source of the third transistor is connected to the second terminal ST. A gate of the first transistor Tr1 and a gate of the second transistor Tr2 are connected to a cathode of the second diode D2 and the drain of the third transistor Tr3.

A gate of the third transistor Tr3 is connected to the control terminal GT. The drain of the first transistor Tr1 and the drain of the second transistor Tr2 are electrically connected to the third electrode 50 of the switching element SD.

Figure 2:
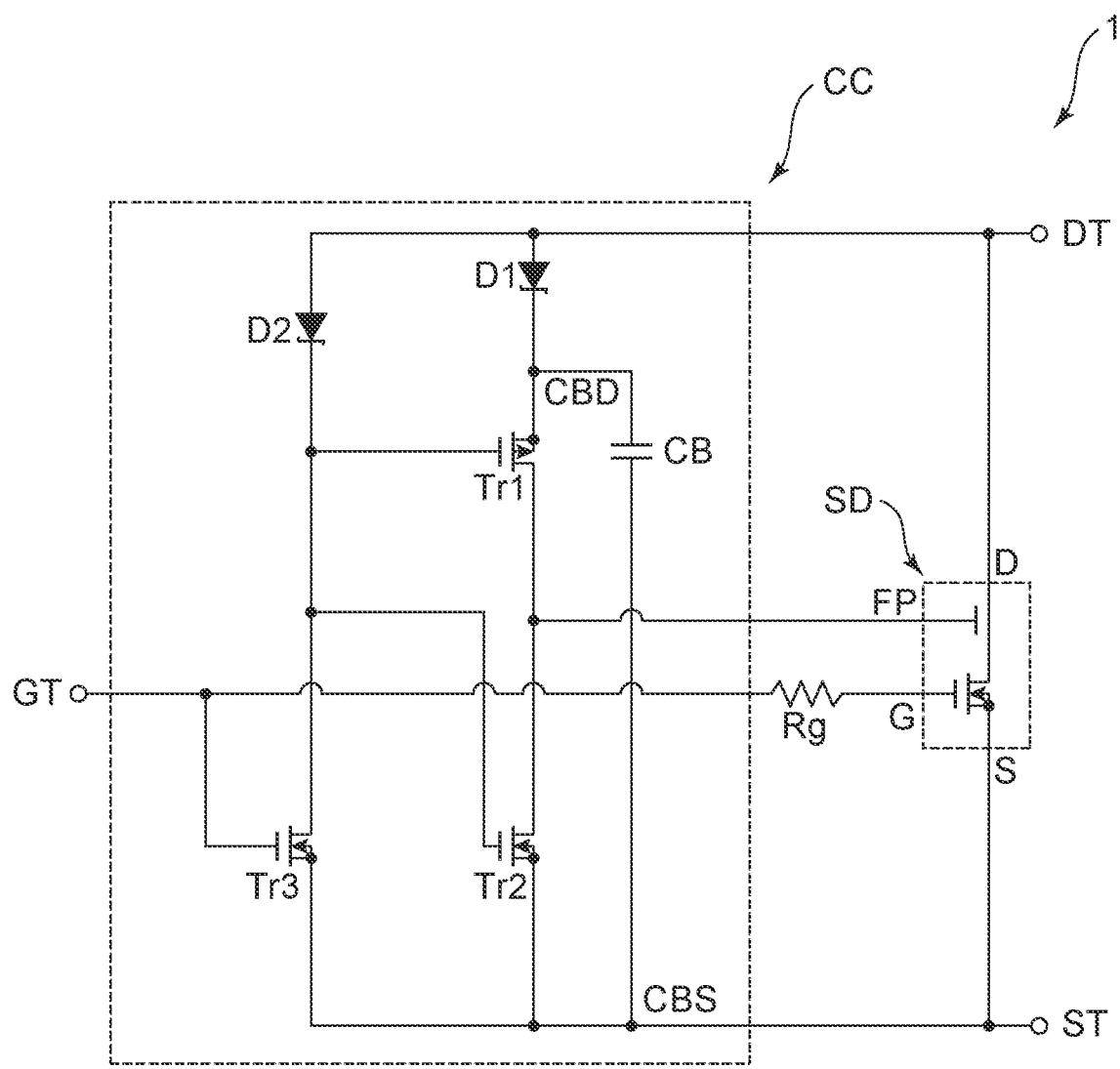
FIG. 2 is a circuit diagram showing the semiconductor device according to the first embodiment.

FIG. 2 is a circuit diagram showing the semiconductor device 1 according to the first embodiment. As shown in FIG. 2, the switching element SD and the control circuit CC are connected to the first terminal DT and the second terminal ST, and are biased by a voltage Vds (see FIG. 5) applied between the first terminal DT and the second terminal ST.

A drain D of the switching element SD is connected to the first terminal DT, and a source S of the switching element SD is connected to the second terminal ST. Further, a gate G of the switching element SD is connected to the control terminal GT.

The switching element SD is controlled to be turned on and off by a control signal Vg (see FIG. 5) input to the gate G. The control signal Vg is input to the control terminal GT. The control terminal GT is electrically connected to the gate G of the switching element SD. The control signal Vg is supplied, for example, between the control terminal GT and the source S of the switching element SD.

The control signal Vg is also input to the gate of the third transistor Tr3 via the control terminal GT. The third transistor Tr3 is controlled to be turned on and off based on the control signal Vg. Further, the first transistor Tr1 and the second transistor Tr2 are controlled to be turned on and off based on a potential on a drain side of the third transistor Tr3.

For example, when the third transistor Tr3 is in an off-state and the drain side of the third transistor Tr3 is at a high potential "High", the first transistor Tr1 is in an off-state and the second transistor Tr2 is in an on-state. When the third transistor Tr3 is in an on-state, the drain side of the third transistor Tr3 becomes a low potential "Low", the first transistor Tr1 transitions from the off-state to the on-state, and the second transistor Tr2 transitions from the on-state to the off-state.

Figure 3:
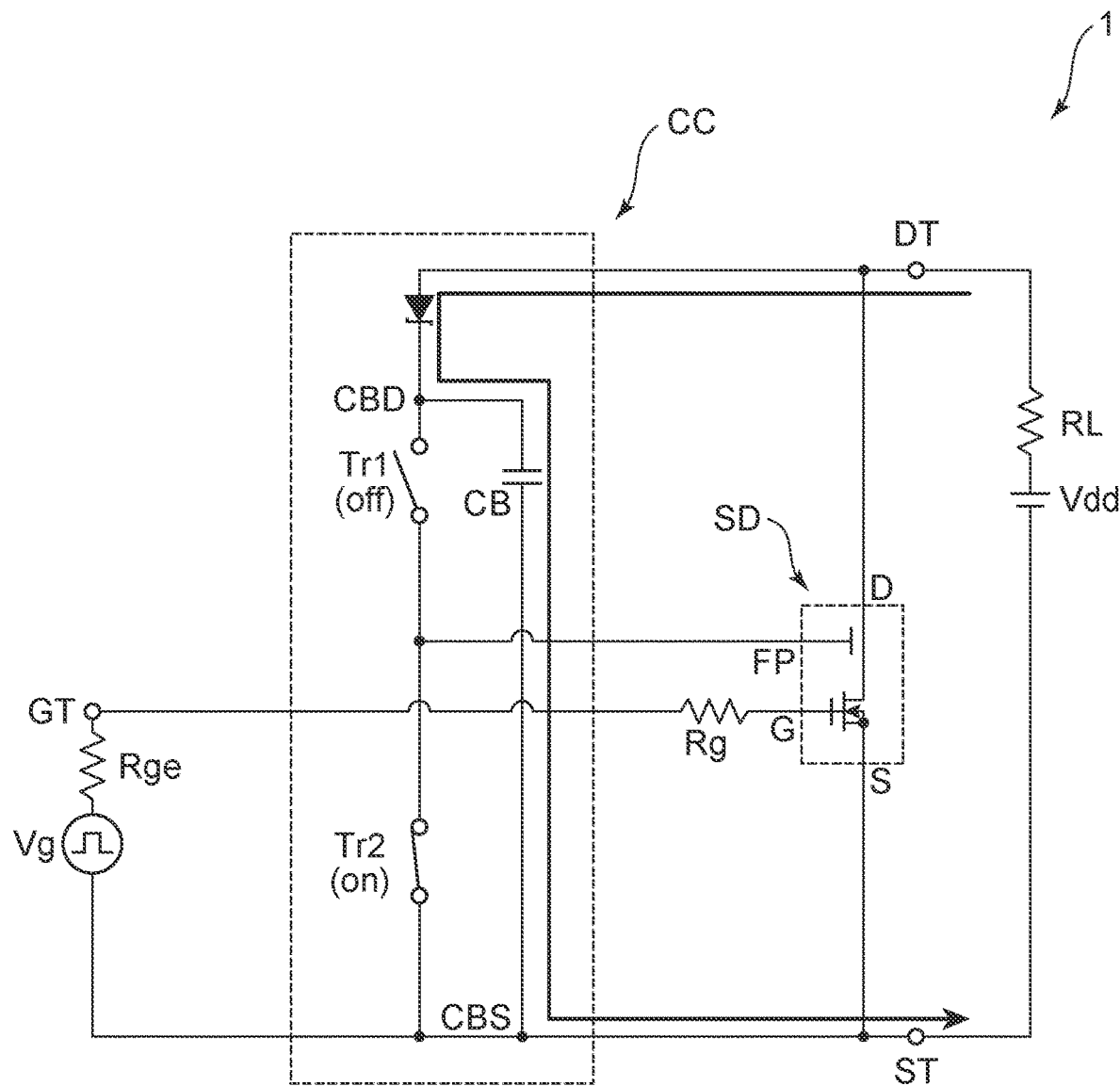
FIG. 3 is a circuit diagram showing an operation of the semiconductor device in an off-state according to the first embodiment.

FIG. 3 is a circuit diagram showing an operation of the semiconductor device 1 in an off-state according to the first embodiment. At this time, the control signal Vg (see FIG. 5) input to the control terminal GT is "Low". The control signal Vg is applied to the gate G of the switching element SD via an external gate resistor Rge, and the switching element SD is in the off-state. A voltage Vdd is applied between the first terminal DT and the second terminal ST via a load resistor RL. A drain voltage Vd-off (see FIG. 5) is applied between the first terminal DT and the second terminal ST.

When the control signal Vg is "Low", the third transistor Tr3 of the control circuit CC is in the off-state (see FIG. 2), and the potential on the drain side of the third transistor Tr3 is "High". At this time, the first transistor Tr1 is in the off-state, and the second transistor Tr2 is in the on-state. The capacitor CB is charged by the drain voltage Vd-off. A field plate FP (the third electrode 50) of the switching element SD has a potential same as that of the second terminal ST via the second transistor Tr2 in the on-state. That is, a potential difference VFP between the field plate FP and the source S of the switching element SD is 0 V (see FIG. 5).

Figure 4:
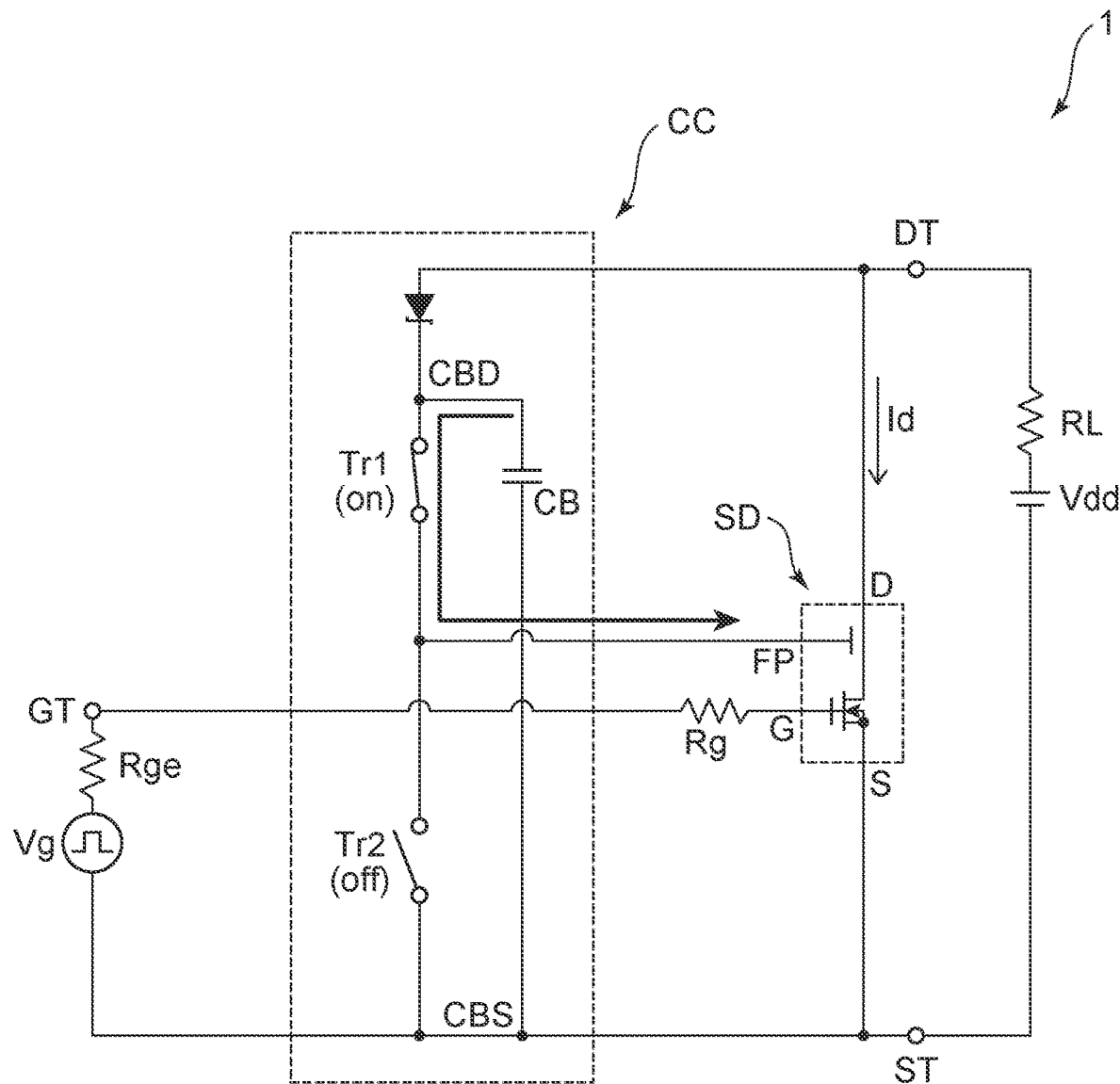
FIG. 4 is a circuit diagram showing an operation of the semiconductor device in an on-state according to the first embodiment.

FIG. 4 is a circuit diagram showing an operation of the semiconductor device 1 in an on-state according to the first embodiment. At this time, the control signal Vg (see FIG. 5) input to the control terminal GT is "High". The gate G of the switching element SD becomes "High", and the switching element SD is in the on-state. A drain current Id flows between the first terminal DT and the second terminal ST, and the voltage between the first terminal DT and the second terminal ST decreases to a level of an on-voltage Vd-on (see FIG. 5).

When the control signal Vg is "High", the third transistor Tr3 (see FIG. 2) of the control circuit CC is in the on-state, and the potential on the drain side of the third transistor Tr3 is "Low". At this time, the first transistor Tr1 is in the on-state, and the second transistor Tr2 is in the off-state. Therefore, electrical connection between the field plate FP of the switching element SD and the second terminal ST is disconnected, and the terminal CBD of the capacitor CB and the field plate FP are electrically connected via the first transistor Tr1 in the on-state. Accordingly, charges in the capacitor CB move to the field plate FP, and the field plate FP has a potential same as that of the terminal CBD of the capacitor CB. That is, a voltage Vc-on between both terminals of the capacitor CB is applied as Vfp-on between the field plate FP and the source S of the switching element SD (see FIG. 5).

Figure 5:
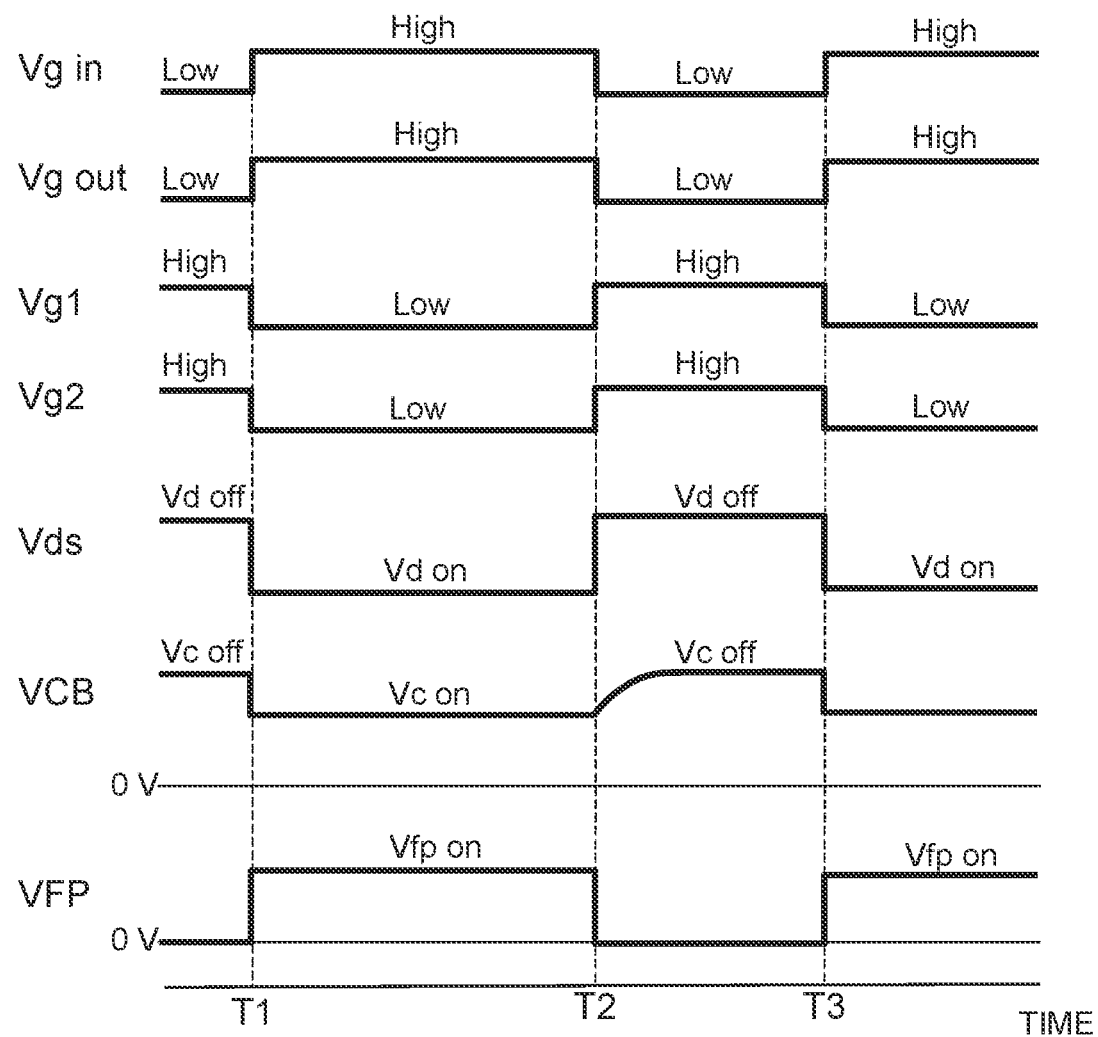
FIG. 5 is a time chart showing a control method for the semiconductor device according to the first embodiment.

FIG. 5 is a time chart showing a control method for the semiconductor device 1 according to the first embodiment. FIG. 5 shows a gate input signal Vg-in, a gate output signal Vg-out, a control signal Vg1 of the first transistor Tr1, a control signal Vg2 of the second transistor Tr2, a source-drain voltage Vds, an inter-terminal voltage VCB of the capacitor CB, and the field plate voltage VFP.

As shown in FIG. 5, the gate input signal Vg-in input to the control terminal GT increases, for example, from Low to High at a time T1. The gate output signal Vg-out output from the control circuit CC is equal to the gate input signal Vg-in, and is applied between the gate G and the source S of the switching element SD. Accordingly, the switching element SD transitions from the off-state to the on-state (hereinafter, turned on).

The gate input signal Vg-in is also input to the gate of the third transistor Tr3, and the third transistor Tr3 is turned on at the time T1. Therefore, the potential on the drain side of the third transistor Tr3 changes from High to Low, and the control signal Vg1 of the first transistor Tr1 and the control signal Vg2 of the second transistor Tr2 also change from High to Low. Accordingly, the first transistor Tr1 is turned on, and the second transistor Tr2 transitions from the on-state to the off-state (hereinafter, turned off).

The source-drain voltage Vds decreases from an off-voltage Vd-off to the on-voltage Vd-on at the time T1. Since the on-voltage Vd-on is lower than a voltage Vc-off of the capacitor CB when the switching element SD is in the off-state, charging of the capacitor CB is stopped at the time T1.

The capacitor CB is electrically connected to the field plate FP of the switching element SD via the first transistor Tr1 in the on-state. On the other hand, the electrical connection between the field plate FP and the source S is disconnected by turning off the second transistor Tr2. Therefore, the charges of the capacitor CB move to the field plate FP via the first transistor Tr1. Accordingly, the inter-terminal voltage of the capacitor CB decreases to the voltage Vc-on when the switching element SD is in the on-state.

A parasitic capacitance of the field plate FP in the switching element SD is charged by the charges moving from the capacitor CB until the potential difference between the field plate FP and the source S is equal to the inter-terminal voltage VCB of the capacitor CB. Accordingly, the field plate voltage VFP increases from 0 V to Vfp-on at the time T1. Vfp-on is equal to the voltage Vc-on of the capacitor CB.

Further, the gate input signal Vg-in changes from High to Low at a time T2. The gate output signal Vg-out also changes from High to Low, and the switching element SD is turned off. The third transistor Tr3 is also turned off. Therefore, the potential on the drain side of the third transistor Tr3 changes from Low to High, and the control signal Vg1 of the first transistor Tr1 and the control signal Vg2 of the second transistor Tr2 also change from Low to High. Accordingly, the first transistor Tr1 is turned off and the second transistor Tr2 is turned on.

At the time T2, the source-drain voltage Vds increases from the on-voltage Vd-on to the off-voltage Vd-off, and charging of the capacitor CB is started. The inter-terminal voltage VCB of the capacitor CB increases from Vc-on to Vc-off. The electrical connection between the capacitor CB and the field plate FP of the switching element SD is cut off by the first transistor Tr1 which is turned off, and the field plate FP and the source S are electrically connected via the second transistor Tr2 which is turned on. Therefore, the field plate voltage VFP between the field plate FP and the source S is 0 V.

Subsequently, the gate input signal Vg-in changes from Low to High at a time T3, and the switching element SD and the third transistor Tr3 are turned on. Accordingly, the first transistor Tr1 is turned on, and the second transistor Tr2 is turned off. As a result, the field plate voltage VFP between the field plate FP and the source S increases from 0 V to Vfp-on.

Figure 6:
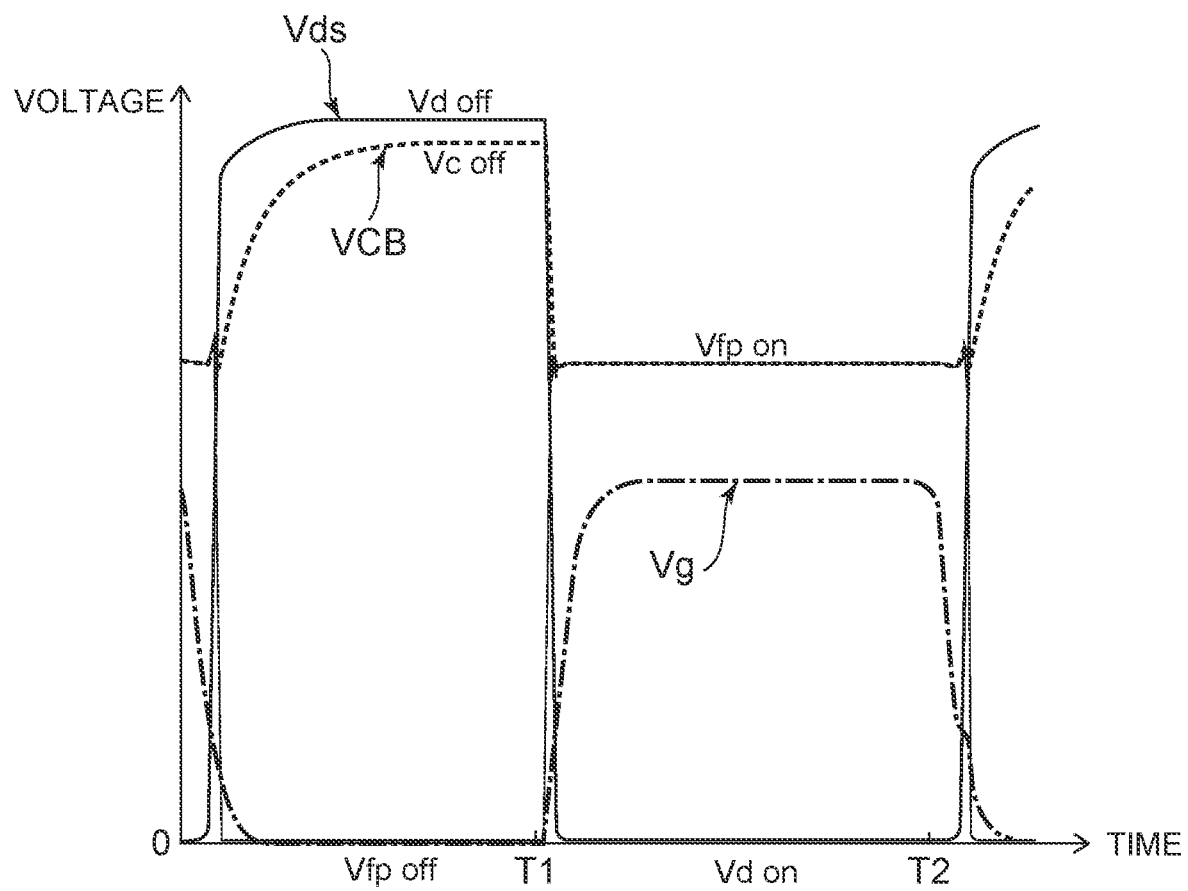
FIG. 6 is a time chart showing a control waveform of the semiconductor device according to the first embodiment.

FIG. 6 is a time chart showing a control waveform of the semiconductor device 1 according to the first embodiment. A vertical axis represents a voltage, and a horizontal axis represents a time. FIG. 6 shows the control signal Vg, the source-drain voltage Vds, and the inter-terminal voltage VCB of the capacitor CB.

As shown in FIG. 6, the control signal Vg rises at the time T1 and drops at the time T2. When the control signal Vg exceeds a gate threshold voltage of the switching element SD, the switching element SD is turned on, and the source-drain voltage Vds decreases from the off-voltage Vd-off to, for example, the on-voltage Vd-on close to 0 V. In response to this, the inter-terminal voltage VCB of the capacitor CB decreases to a level of Vc-on (=Vfp-on). At this time, the voltage Vfp-on applied between the field plate FP and the source S is favorably higher than the "High" level of the control signal Vg. In order to apply a sufficient level of voltage Vfp-on between the field plate FP and the source S, for example, a capacitance value of the capacitor CB is favorably larger than the parasitic capacitance between the field plate FP and the drain D.

When the control signal Vg decreases to a level lower than the gate threshold voltage of the switching element SD, the switching element SD is turned off, and the source-drain voltage Vds increases from the on-voltage Vd-on to the off-voltage Vd-off. Accordingly, the charging of the capacitor CB is started, and the inter-terminal voltage VCB increases to Vc-off.

Figure 7:
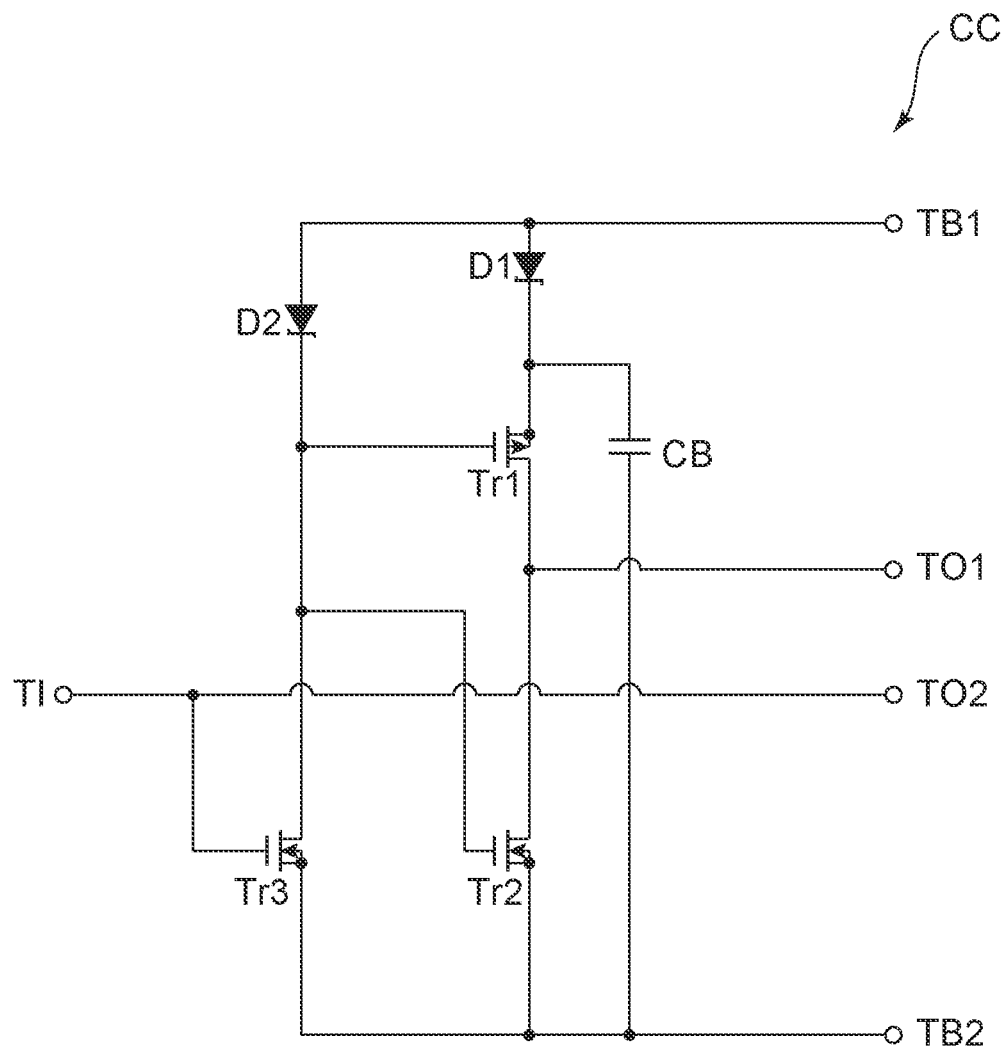
FIG. 7 is a circuit diagram showing the control circuit according to the first embodiment.

FIG. 7 is a circuit diagram showing the control circuit CC according to the first embodiment. The control circuit CC includes, for example, bias terminals TB1 and TB2, an input-side terminal TI, and output-side terminals TO1 and TO2. The terminals are separated from one another.

The bias terminal TB1 is connected to, for example, the first terminal DT, and the bias terminal TB2 is connected to, for example, the second terminal ST. The input-side terminal TI corresponds to the control terminal GT. The output-side terminal TO1 is connected to the drain of the first transistor Tr1 and the drain of the second transistor Tr2. The output-side terminal TO2 is connected to the input-side terminal TI, and a signal input to the input-side terminal TI is directly output from the output-side terminal TO2.

The input-side terminal TI is also connected to the gate of the third transistor Tr3, and the third transistor Tr3 is controlled to be turned on and off by the signal input to the input-side terminal TI.

When the switching element SD to be driven is in the off-state, the first transistor Tr1 of the control circuit CC is in the off-state, and the second transistor Tr2 is in the on-state. Therefore, a voltage substantially equal to the voltage between the drain and the source of the switching element SD is applied between the drain and the source of the first transistor Tr1. Therefore, a breakdown voltage between the drain and the source of the first transistor Tr1 is favorably not less than a breakdown voltage between the drain and the source of the switching element SD.

When the switching element SD is in the off-state, the third transistor Tr3 is in the off-state. Therefore, a voltage substantially equal to the voltage between the drain and the source of the switching element SD is applied between the drain and the source of the third transistor Tr3. Therefore, a breakdown voltage between the drain and the source of the third transistor Tr3 is favorably not less than the breakdown voltage between the drain and the source of the switching element SD.

An input capacitance Ciss, an output capacitance Coss, and a feedback capacitance Crss of the first to third transistors Tr1, Tr2, and Tr3 are favorably smaller than the parasitic capacitances of the switching element SD in order to reduce gate drive loss and switching loss. That is, it is desired that the gate drive loss and the switching loss in the control circuit CC are negligible in comparison with the switching loss of the switching element SD.

Figure 8A:
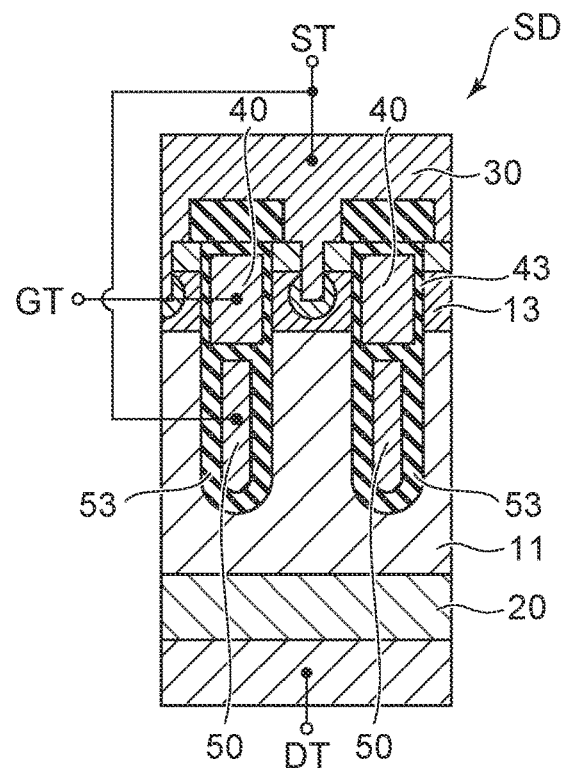
FIG. 8A is a schematic cross-sectional view showing a control method for the semiconductor device according to a comparative example.
Figure 8B:
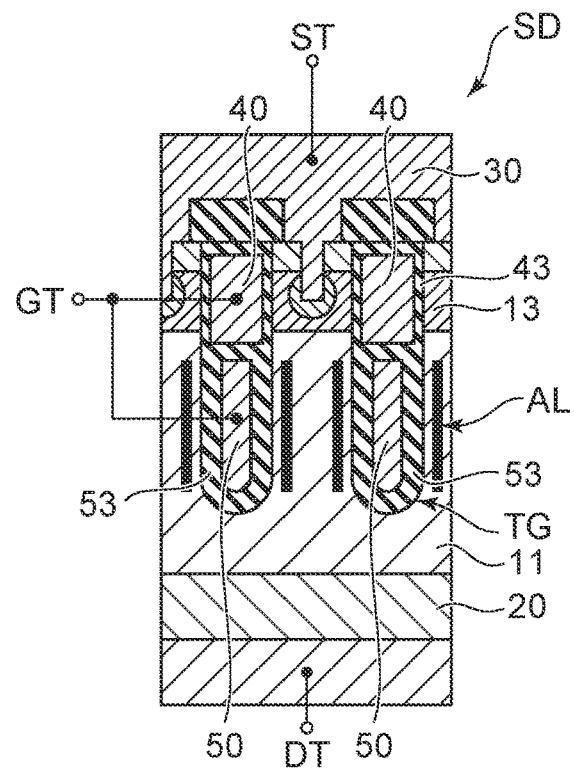
FIG. 8B is a schematic cross-sectional view showing a control method for the semiconductor device according to a comparative example.

FIGS. 8A and 8B are schematic cross-sectional views showing a control method for the semiconductor device 1 according to a comparative example. FIGS. 8A and 8B show a control method for the third electrodes 50 of the switching element SD.

In the example shown in FIG. 8A, the third electrodes 50 are electrically connected to the second electrode 30 in a manner of having a potential same as that of the second electrode 30. In other words, the field plate FP is connected to the source S.

In the example shown in FIG. 8B, the third electrodes 50 are connected to the control terminal GT. That is, the field plate FP has a potential same as that of the gate G. For example, when a "High" level control signal Vg is applied from the control terminal GT to the control electrodes 40 and the switching element SD is turned on, an n-type accumulation layer AL is induced in the first semiconductor layer 11 facing the third electrode 50 (the field plate FP). Accordingly, an electrical resistance of the first semiconductor layer 11 between the adjacent trenches TG is reduced, and the on-resistance of the switching element SD can be reduced.

Figure 9A:
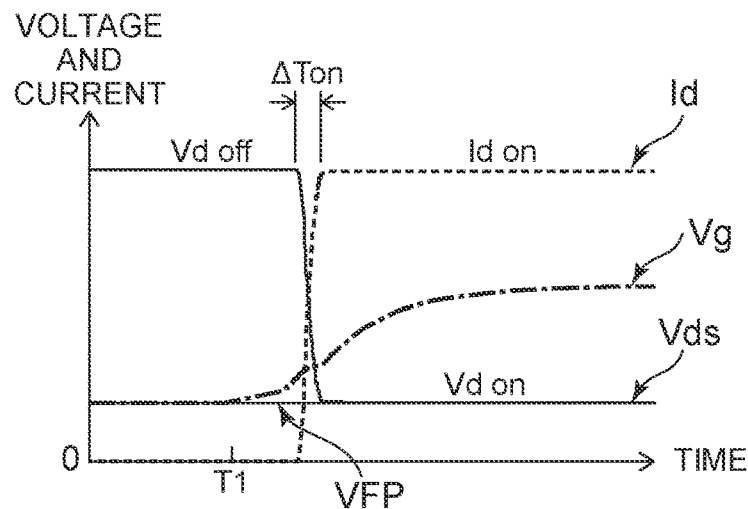
FIG. 9A is a graph showing switching characteristics of the semiconductor device according to the first embodiment and the comparative example.
Figure 9B:
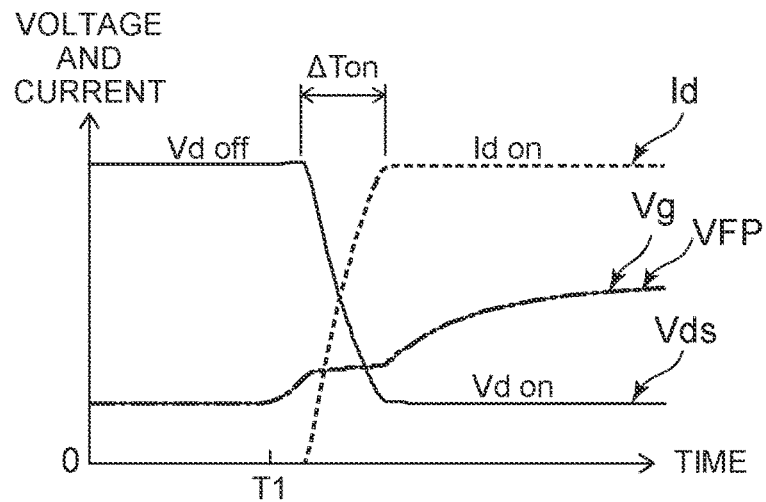
FIG. 9B is a graph showing switching characteristics of the semiconductor device according to the first embodiment and the comparative example.
Figure 9C:
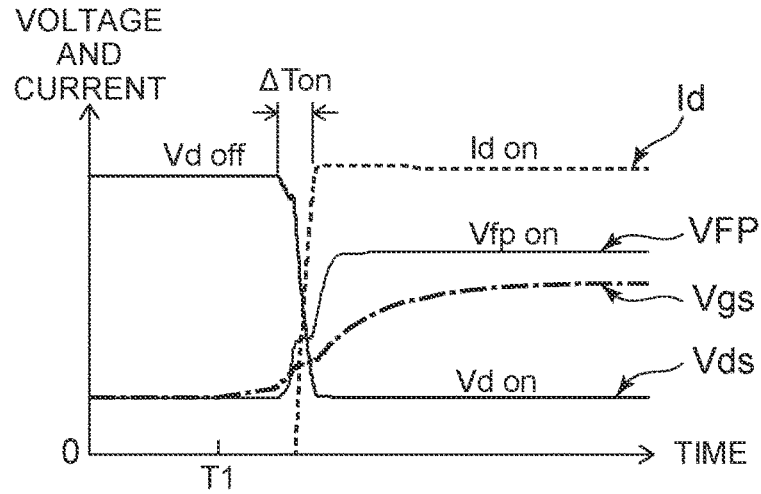
FIG. 9C is a graph showing switching characteristics of the semiconductor device according to the first embodiment and the comparative example.

FIGS. 9A to 9C are graphs showing switching characteristics of the semiconductor device 1 according to the first embodiment and the comparative example. FIGS. 9A to 9C show voltage waveforms and current waveforms at the time of turning on the semiconductor device 1. A horizontal axis represents a time.

FIG. 9A shows turn-on characteristics when the field plate FP is connected to the source S. At the time T1, when the control signal Vg rises and exceeds the gate threshold voltage of the switching element SD, the drain current Id starts to flow and increases to a level of an on-current Id-on. On the other hand, the source-drain voltage Vds decreases from the off-voltage Vd-off to the on-voltage Vd-on. During the period, the voltage VFP between the field plate FP and the source S is 0 V.

FIG. 9B shows turn-on characteristics when the field plate FP is connected to the gate G. At the time T1, when the control signal Vg rises and exceeds the gate threshold voltage of the switching element SD, the drain current Id starts to flow. Since the control signal Vg is also supplied to the field plate FP, the n-type accumulation layer AL is induced in the first semiconductor layer 11 facing the field plate FP, and the on-resistance can be reduced. However, the parasitic capacitance between the gate and the drain is increased, and the rise of the control signal Vg is delayed. As a result, a time for the drain current Id to reach the level of Id-on and a time for the source-drain voltage Vds to decrease to Vd-on are delayed, and a turn-on time ΔTon is lengthened. That is, when the field plate FP is connected to the gate G, the on-resistance can be reduced, whereas the turn-on time ΔTon becomes longer.

FIG. 9C shows turn-on characteristics in the control method according to the embodiment. At the time T1, when the control signal Vg rises and exceeds the gate threshold voltage of the switching element SD, the drain current Id starts to flow. On the other hand, the source-drain voltage Vds decreases from the off-voltage Vd-off to the on-voltage Vd-on. During the period, the voltage VFP between the field plate FP and the source S increases from 0 V to Vfp-on. Vfp-on is higher than the control signal Vg, and the field plate FP is biased to a potential higher than that of the control signal Vg. Accordingly, the n-type accumulation layer having a higher density is induced in the first semiconductor layer 11, and the on-resistance can be further lowered.

In this case, the inter-terminal voltage VCB of the capacitor CB is applied to the field plate FP, and the capacitance between the field plate FP and the drain is disconnected from the capacitance between the gate and the drain. Therefore, the parasitic capacitance between the gate and the drain can be prevented from increasing. Accordingly, the turn-on time ΔTon can be shortened as compared with the case where the field plate FP is connected to the gate G. The turn-on time ΔTon in the control method according to the embodiment is equal to the turn-on time ΔTon when the field plate FP is connected to the source S.

Figure 10A:
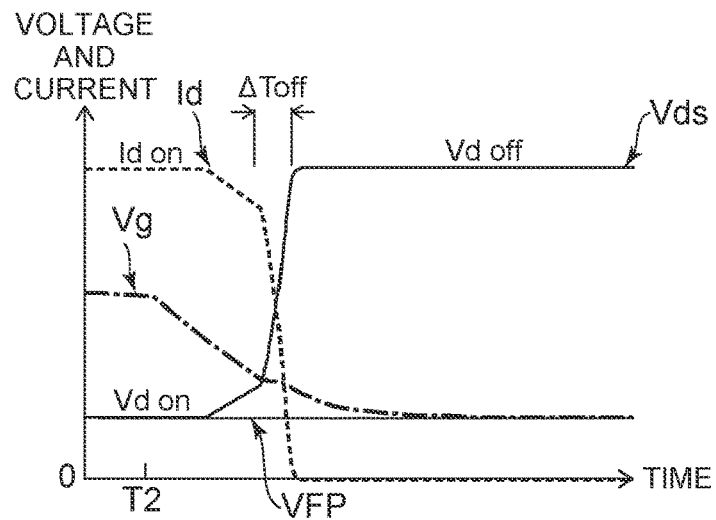
FIG. 10A is a graph showing another switching characteristic of the semiconductor device according to the first embodiment and the comparative example.
Figure 10B:
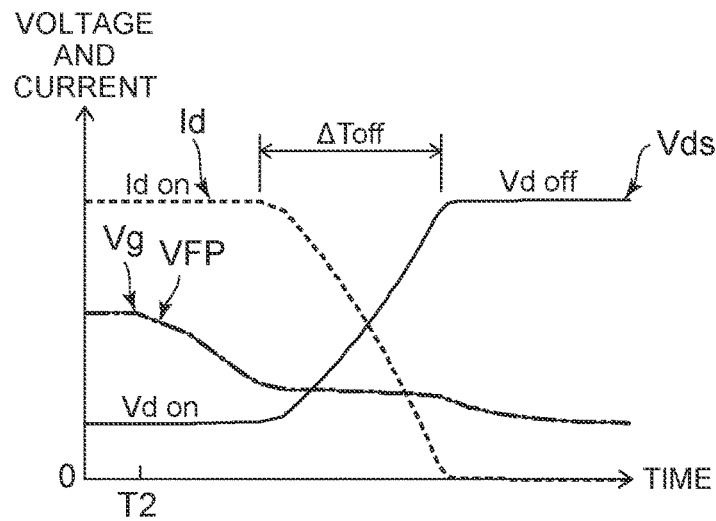
FIG. 10B is a graph showing another switching characteristic of the semiconductor device according to the first embodiment and the comparative example.
Figure 10C:
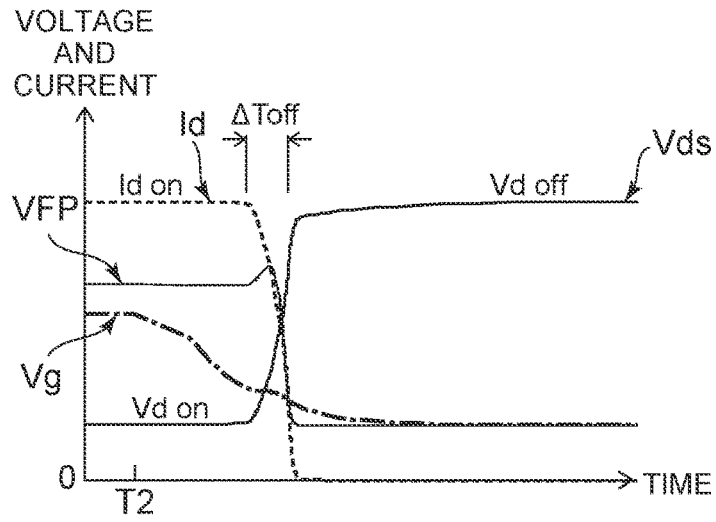
FIG. 10C is a graph showing another switching characteristic of the semiconductor device according to the first embodiment and the comparative example.

FIGS. 10A to 10C are graphs showing another switching characteristic of the semiconductor device 1 according to the first embodiment and the comparative example. FIGS. 10A to 10B show voltage waveforms and current waveforms at the time of turning off the semiconductor device 1. A horizontal axis represents a time.

FIG. 10A shows turn-off characteristics when the field plate FP is connected to the source S. At the time T2, when the control signal Vg drops and approaches the gate threshold voltage of the switching element SD, the drain current Id starts to decrease and decreases to 0 level. On the other hand, the source-drain voltage Vds increases from the on-voltage Vd-on to the off-voltage Vd-off. During the period, the voltage VFP between the field plate FP and the source S is 0 V.

FIG. 10B shows turn-off characteristics when the field plate FP is connected to the gate G. At the time T2, when the control signal Vg drops and approaches the gate threshold voltage of the switching element SD, the drain current Id starts to decrease and decreases to the 0 level. The n-type accumulation layer AL induced in the first semiconductor layer 11 disappears as the control signal Vg decreases. In this case, since the parasitic capacitance between the gate and the drain is large, the drop of the control signal Vg is also delayed. As a result, a time for the drain current Id to reach the 0 level from Id-on and a time for the source-drain voltage Vds to rise from Vd-on to Vd-off are delayed, and a turn-off time ΔToff is lengthened.

FIG. 10C shows turn-off characteristics in the control method according to the embodiment. At the time T2, when the control signal Vg drops and approaches the gate threshold voltage of the switching element SD, the drain current Id starts to decrease. The source-drain voltage Vds also increases from the on-voltage Vd-on to the off-voltage Vd-off. During the period, the voltage VFP decreases from Vfp-on to 0 V. Therefore, the n-type accumulation layer induced in the first semiconductor layer 11 disappears.

In the control method according to the embodiment, when the switching element SD is turned off, the electrical connection between the field plate FP and the capacitor CB is cut off, and the field plate FP is connected to the source S. Therefore, the charges are discharged from the field plate FP to the source S, and the field plate voltage VFP decreases from Vfp-on to 0 V. Therefore, the discharge of the charges from the field plate FP does not affect the turn-off of the switching element SD, and the turn-off time ΔToff can be shortened.

Therefore, in the semiconductor device 1, a so-called boot strap circuit including the capacitor CB is provided in the control circuit CC, and the voltage VFP between the field plate FP and the source S is controlled. The capacitor CB is charged from the drain side when the switching element SD is turned off, and when the switching element SD is turned on, the charges are charged to the field plate FP. That is, since the potential of the field plate FP is controlled independently of the gate electrode, the turn-on time and the turn-off time can be shortened, and the loss of a gate driver can be avoided. Further, by biasing the field plate FP to a potential higher than the potential of the gate electrode, the density of the n-type accumulation layer AL can be increased to further reduce the on-resistance.

Figure 11:
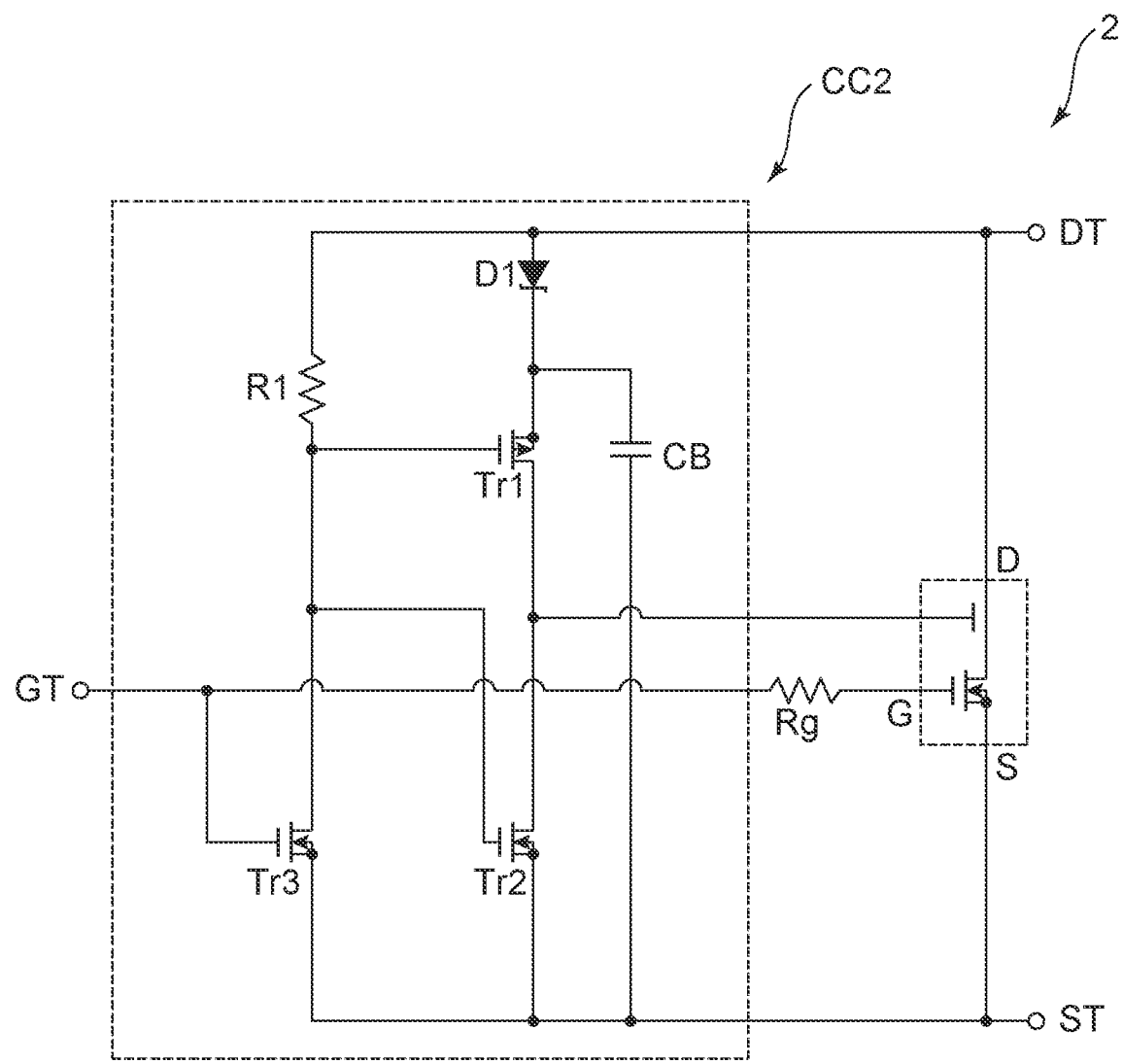
FIG. 11 is a circuit diagram showing a semiconductor device according to a variation of the first embodiment.

FIG. 11 is a circuit diagram showing a semiconductor device 2 according to a variation of the first embodiment. The semiconductor device 2 includes, for example, a switching element SD and a control circuit CC2.

In the example, the second diode D2 (see FIG. 2) between the first terminal DT and the third transistor Tr3 is replaced with a resistor R1 in the control circuit CC2. That is, when a switching speed of the first to third transistors Tr1, Tr2, and Tr3 in the control circuit CC2 is sufficiently higher than a switching speed of the switching element SD, the circuit can be simplified and reduced in cost using the resistor R1 instead of the second diode D2.

Figure 12:
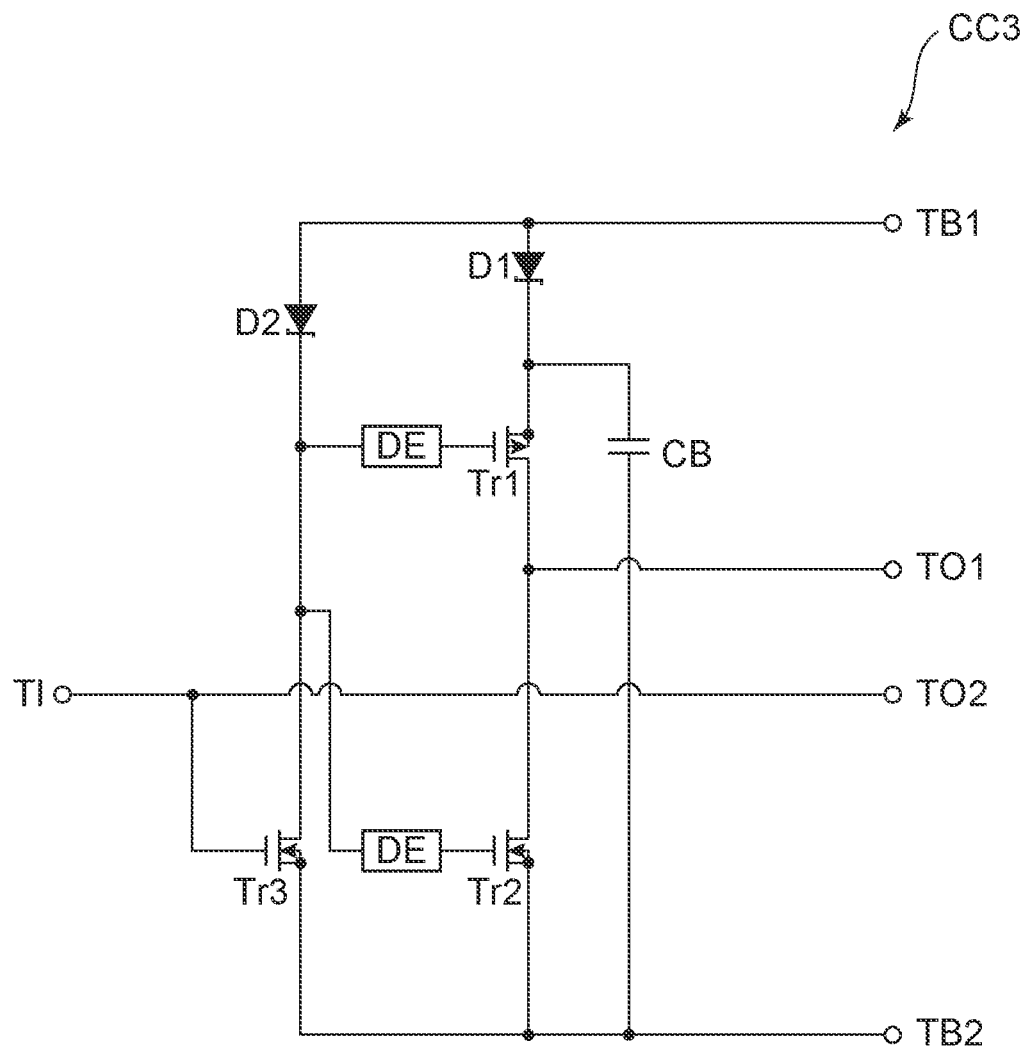
FIG. 12 is a circuit diagram showing a control circuit according to another variation of the first embodiment.

FIG. 12 is a circuit diagram showing a control circuit CC3 according to another variation of the first embodiment. In the example, delay circuits DE are separately provided between the gate of the first transistor Tr1 and the drain of the third transistor Tr3 and between the gate of the second transistor Tr2 and the drain of the third transistor Tr3.

Figure 13:
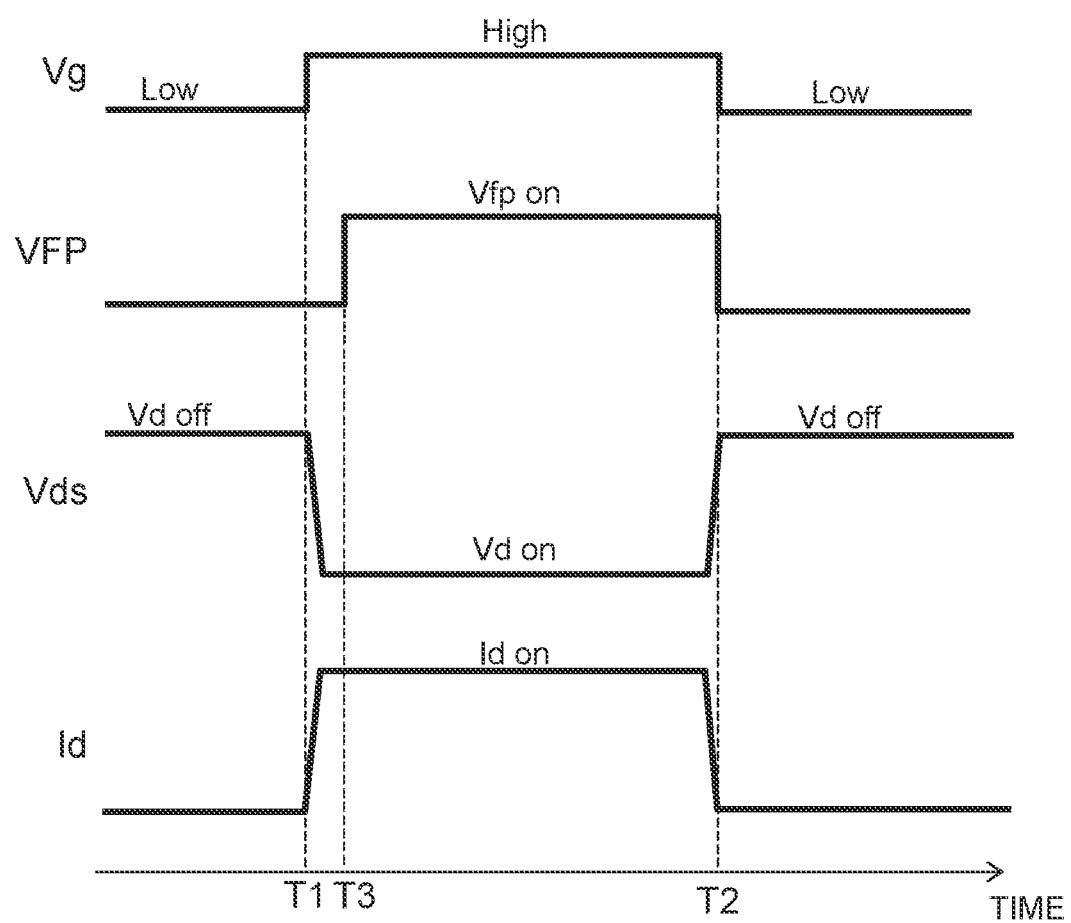
FIG. 13 is a time chart showing a control method for the semiconductor device according to another variation of the first embodiment.

FIG. 13 is a time chart showing a control method for the semiconductor device 1 according to another variation of the first embodiment. FIG. 13 shows the control signal Vg, the source-drain voltage Vds, the drain current Id, and the voltage VFP between the field plate FP and the source S.

As shown in FIG. 13, the control signal Vg input to the control terminal GT increases, for example, from Low to High at the time T1. The control signal Vg is applied between the gate G and the source S of the switching element SD (see FIG. 2). Accordingly, the switching element SD is turned on, and the drain current Id increases from the 0 level to the on-current Id-on. Accordingly, the source-drain voltage Vds decreases from the off-voltage Vd-off to the on-voltage Vd-on.

Further, at the time T2 after the time T1, the control signal Vg is decreased from High to Low. Accordingly, the switching element SD is turned off, and the drain current Id decreases from the on-current Id-on to the 0 level. Accordingly, the source-drain voltage Vds increases from the on-voltage Vd-on to the off-voltage Vd-off.

On the other hand, the voltage VFP between the field plate FP and the source S is controlled to increase from the 0 level to Vfp-on at a time T3 after the time T1 and before the time T2. Such rising control is performed in the control circuit CC3. That is, delay between the time T1 and the time T3 is controlled by the delay circuits DE.

For example, when the first transistor Tr1 is turned on due to noise or the like of the control signal Vg while the source-drain voltage remains at the off-voltage Vd-off, Vfp-on is applied to the field plate FP. Therefore, dielectric breakdown may occur between the field plate FP and the gate G. Therefore, it is favorable to increase the field plate voltage VFP to Vfp-on after a timing at which the switching element SD is turned on. A Schmitt trigger circuit, for example, can be used as the delay circuit DE for delaying the rise of the field plate voltage VFP.

Second Embodiment

Figure 14:
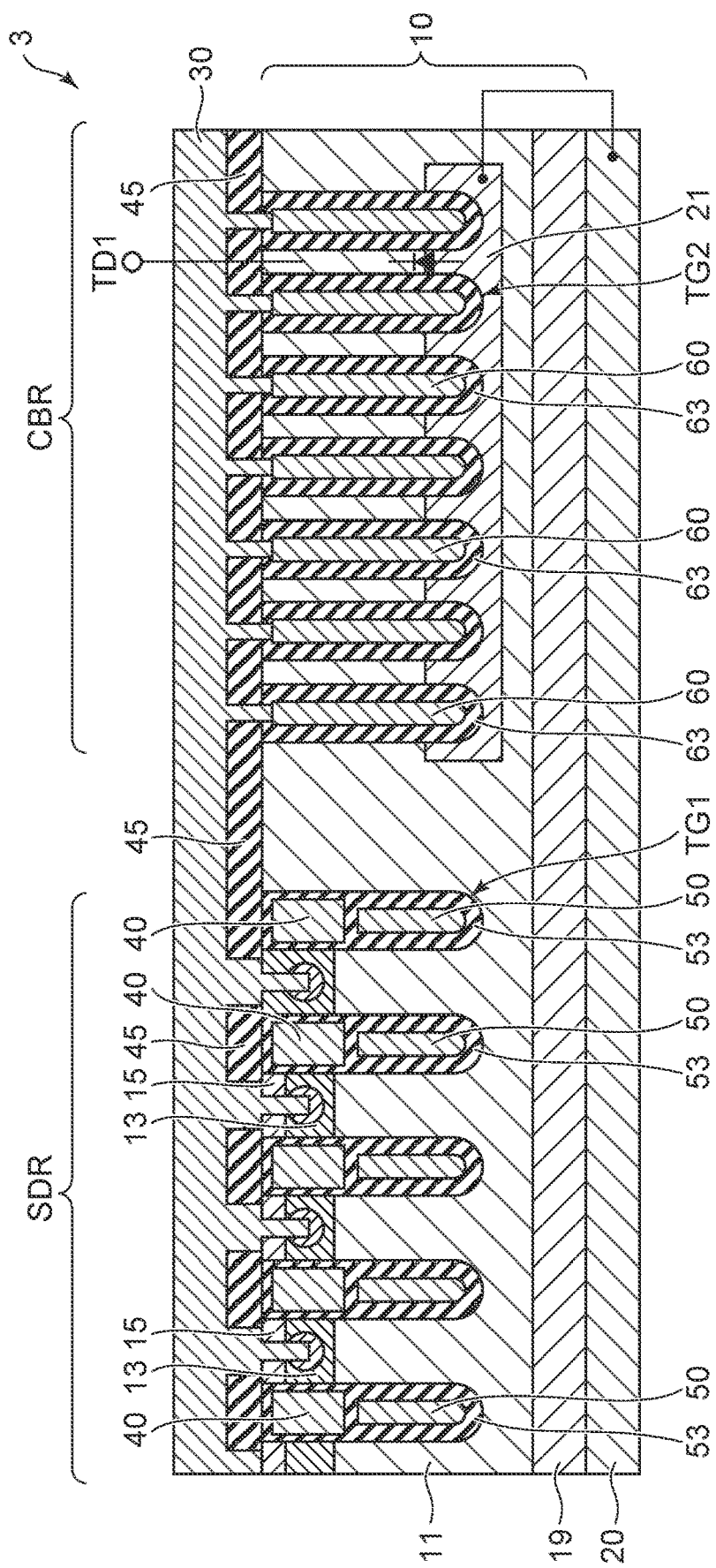
FIG. 14 is a schematic cross-sectional view showing a semiconductor device according to a second embodiment.

FIG. 14 is a schematic cross-sectional view showing a semiconductor device 3 according to a second embodiment. The semiconductor device 3 has a structure in which the switching element SD and the capacitor CB are monolithically integrated. The switching element SD has a structure same as that of the MOS transistor shown in FIG. 1.

As shown in FIG. 14, the semiconductor portion 10 includes a switching region SDR and a capacitor region CBR between the first electrode 20 and the second electrode 30. The switching region SDR and the capacitor region CBR are arranged in a direction along a back surface of the semiconductor portion 10. The second electrode 30 is provided on a surface of the semiconductor portion 10 via, for example, interlayer insulating films 45 in the capacitor region CBR.

A first trench TG1 is provided in the switching region SDR, and a second trench TG2 is provided in the capacitor region CBR. The first trench TG1 includes the control electrodes 40 and the third electrodes 50. The second trench TG2 includes fourth electrodes 60. The fourth electrodes 60 face the semiconductor portion 10 via dielectric films 63. The fourth electrode 60 is electrically insulated from the semiconductor portion 10 by the dielectric film 63. The dielectric film 63 is an insulating film having a predetermined dielectric constant.

In the capacitor region CBR, the semiconductor portion 10 includes, for example, the first semiconductor layer 11, the fifth semiconductor layer 19, and a second conductivity type sixth semiconductor layer 21. The first semiconductor layer 11 extends between the first electrode 20 and the second electrode 30. The fifth semiconductor layer 19 is provided between the first electrode 20 and the first semiconductor layer 11. The sixth semiconductor layer 21 is provided in the first semiconductor layer 11. The first semiconductor layer 11 extends between the sixth semiconductor layer 21 and the second electrode 30. A part of the first semiconductor layer 11 is interposed between the fifth semiconductor layer 19 and the sixth semiconductor layer 21.

The second trench TG2 extends from a surface of the semiconductor portion 10 on a second electrode 30 side into the first semiconductor layer 11. A bottom of the second trench TG2 is located in the sixth semiconductor layer 21. The fourth electrode 60 is provided between the first electrode 20 and the second electrode 30, and faces the sixth semiconductor layer 21 via the dielectric film 63. The fourth electrode 60 is connected to the second electrode 30 on an opening side of the second trench TG2. The second electrode 30 is electrically connected to the fourth electrode through a contact hole formed in the interlayer insulating film 45.

The sixth semiconductor layer 21 is electrically connected to, for example, the first electrode 20. In other words, the sixth semiconductor layer 21 is electrically connected to the first electrode 20 without interposing a P-N junction.

In the example, the capacitor CB is provided, for example, between the first semiconductor layer 11 and the fourth electrode 60. The dielectric film 63 is provided such that the capacitor CB has a a predetermined capacitance value. Furthermore, the first semiconductor layer 11 and the sixth semiconductor layer 21 constitute the first diode D1 (see FIG. 2). The sixth semiconductor layer 21 is an anode of the first diode D1 and is electrically connected to the first electrode 20. The first semiconductor layer 11 also serves as a cathode of the first diode D1 and the terminal CBD of the capacitor CB (see FIG. 2).

The first electrode 20 is a drain electrode of the switching element SD and is connected to the anode of the first diode D1 (see FIG. 2). The second electrode 30 is a source electrode of the switching element SD and also serves as the terminal CBS of the capacitor CB (see FIG. 2).

The semiconductor device 3 further includes a diode terminal TD1. The diode terminal TD1 is a cathode terminal of the first diode D1 and is electrically connected to the first semiconductor layer 11. The diode terminal TD1 is connected to, for example, the source of the first transistor Tr1 (see FIG. 2).

Figure 15A:
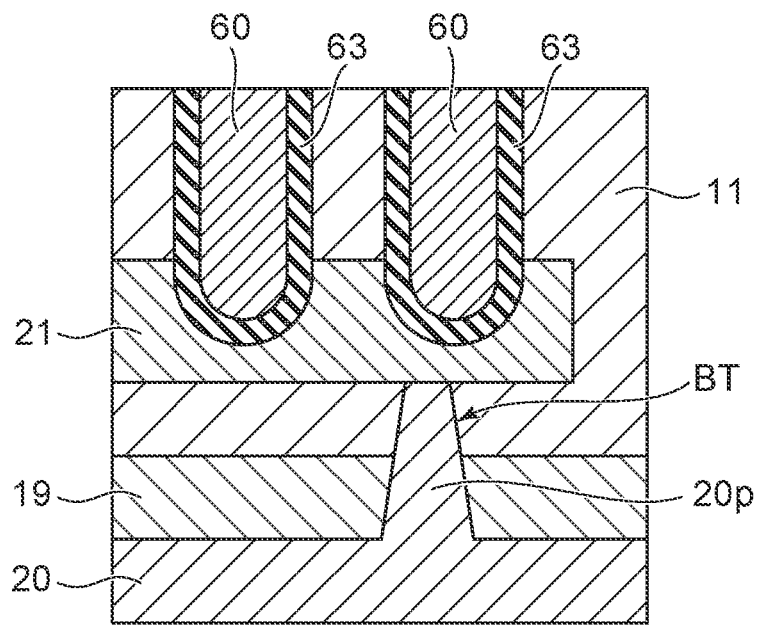
FIG. 15A is a schematic cross-sectional view showing electrode connections in the semiconductor device according to the second embodiment.
Figure 15B:
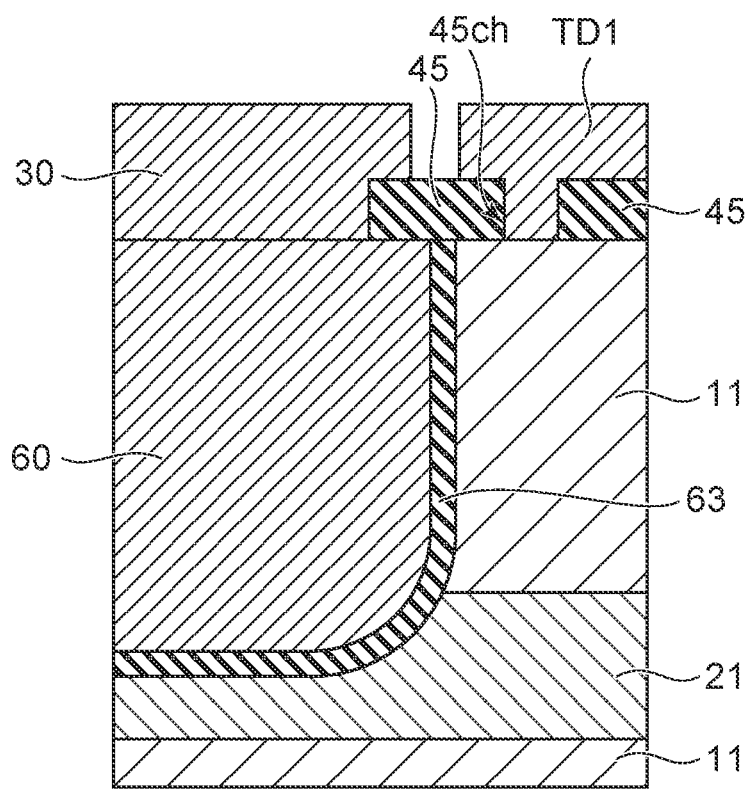
FIG. 15B is a schematic cross-sectional view showing electrode connections in the semiconductor device according to the second embodiment.

FIGS. 15A and 15B are schematic cross-sectional views showing electrode connections in the semiconductor device 3 according to the second embodiment. FIG. 15A illustrates a connection structure between the first electrode 20 and the sixth semiconductor layer 21. FIG. 15B illustrates a connection structure between the diode terminal TD1 and the first semiconductor layer 11.

As shown in FIG. 15A, the first electrode 20 has a contact portion 20p extending inside a contact trench BT provided on a back surface side of the semiconductor portion 10. The contact trench BT has a depth reaching the sixth semiconductor layer 21 through the fifth semiconductor layer 19 and the first semiconductor layer 11. The first electrode 20 is connected to the sixth semiconductor layer 21 at the contact portion 20p extending into the contact trench BT.

As shown in FIG. 15B, the diode terminal TD1 is provided on the first semiconductor layer 11 via the second insulating film 45. The diode terminal TD1 is provided on the second insulating film 45 in a manner of being separated from the second electrode 30. The diode terminal TD1 has a portion extending into a contact hole 45ch formed in the second insulating film 45. That is, the diode terminal TD1 is connected to the first semiconductor layer 11 through the contact hole 45ch.

Figure 16:
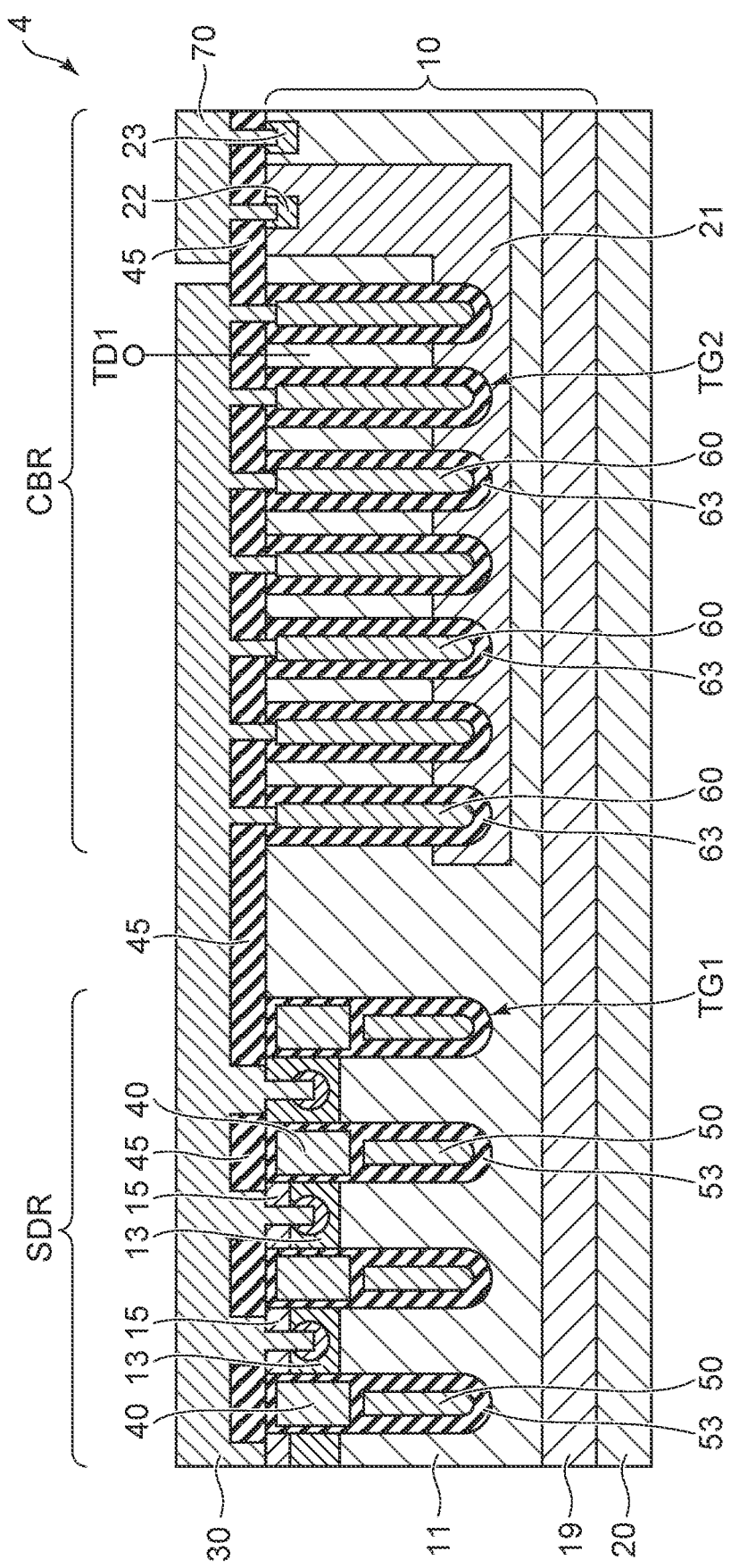
FIG. 16 is a schematic cross-sectional view showing a semiconductor device according to a variation of the second embodiment.

FIG. 16 is a schematic cross-sectional view showing a semiconductor device 4 according to a variation of the second embodiment. In the example, the semiconductor device 4 also has a structure in which the switching element SD and the capacitor CB are monolithically integrated. The switching element SD has a structure same as that of the MOS transistor shown in FIG. 1.

The semiconductor device 4 includes the first electrode 20, the second electrode 30, the control electrode 40, the third electrode 50, the fourth electrode 60 and a fifth electrode 70. The semiconductor portion 10 is located between the first electrode 20 and the second electrode 30 and between the first electrode 20 and the fifth electrode 70, and includes a switching region SDR and a capacitor region CBR. The fifth electrode 70 is provided on the interlayer insulating film 45 on a surface side of the capacitor region CBR. The second electrode 30 and the fifth electrode 70 are provided on the interlayer insulating film 45 in a manner of being separated from each other.

The control electrodes 40 and the third electrodes 50 are provided inside the first trench TG1 in the switching region SDR. The fourth electrode 60 is provided inside the second trench TG2 in the capacitor region CBR. The fourth electrode 60 is connected to the second electrode 30 through, for example, a contact hole formed in the interlayer insulating film 45.

In the capacitor region CBR, the semiconductor portion 10 includes the first semiconductor layer 11, the fifth semiconductor layer 19, the sixth semiconductor layer 21, a second conductivity type seventh semiconductor layer 22, and a first conductivity type eighth semiconductor layer 23. The fifth semiconductor layer 19 is provided between the first semiconductor layer 11 and the first electrode 20.

The sixth semiconductor layer 21 is provided in the first semiconductor layer 11 between the first electrode 20 and the second electrode 30 and between the first electrode 20 and the fifth electrode 70. The first semiconductor layer 11 extends between the sixth semiconductor layer 21 and the second electrode 30. A part of the first semiconductor layer 11 is interposed between the fifth semiconductor layer 19 and the sixth semiconductor layer 21.

The sixth semiconductor layer 21 is led out to a surface side of the semiconductor portion 10 between the first electrode 20 and the fifth electrode 70. On the surface side of the semiconductor portion 10, the sixth semiconductor layer 21 is electrically connected to the fifth electrode 70 via the seventh semiconductor layer 22. The seventh semiconductor layer 22 is provided between the sixth semiconductor layer 21 and the fifth electrode 70 and contains a second conductivity type impurity having a concentration higher than a concentration of a second conductivity type impurity of the sixth semiconductor layer 21. The fifth electrode 70 is connected to the seventh semiconductor layer 22 through a contact hole formed in the interlayer insulating film 45.

The eighth semiconductor layer 23 is provided between the first semiconductor layer 11 and the fifth electrode 70. For example, the eighth semiconductor layer 23 is provided in the first semiconductor layer 11 on the surface side of the semiconductor portion 10. The eighth semiconductor layer 23 contains a first conductivity type impurity having a concentration higher than a concentration of a first conductivity type impurity in the first semiconductor layer 11. The fifth electrode 70 is connected to the eighth semiconductor layer 23 through another contact hole formed in the interlayer insulating film 45. The fifth electrode 70 is electrically connected to the first semiconductor layer 11 via the eighth semiconductor layer 23.

In the example, the first electrode 20 is also a drain electrode of the switching element SD. The second electrode 30 is a source electrode of the switching element SD and also serves as the source-side terminal CBS of the capacitor CB.

The first semiconductor layer 11 and the sixth semiconductor layer 21 constitute the first diode D1 (see FIG. 2). The fifth electrode 70 is an anode electrode of the first diode D1, and is electrically connected to the first electrode 20 via the eighth semiconductor layer 23, the first semiconductor layer 11, and the fifth semiconductor layer 19.

The capacitor CB is provided between the first semiconductor layer 11 and the fourth electrode 60. The first semiconductor layer 11 also serves as a cathode of the first diode D1 and the terminal CBD of the capacitor CB (see FIG. 2). The diode terminal TD1 is electrically connected to the first semiconductor layer 11. The diode terminal TD1 is a cathode terminal of the first diode D1, and is connected to, for example, the source of the first transistor Tr1.

Third Embodiment

Figure 17:
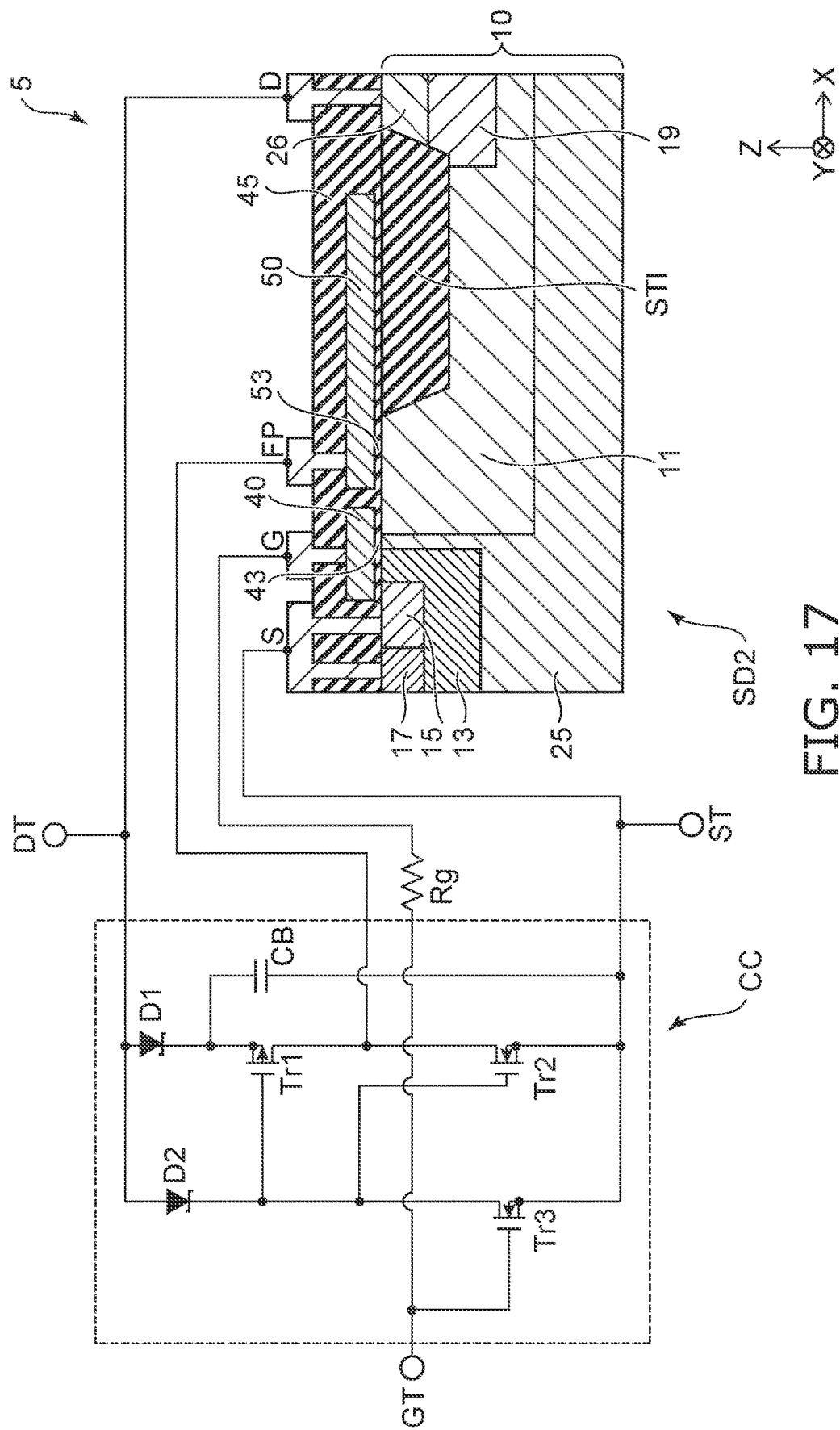
FIG. 17 is a schematic view showing a semiconductor device according to a third embodiment.

FIG. 17 is a schematic view showing a semiconductor device 5 according to a third embodiment. The semiconductor device 5 includes, for example, a switching element SD2 and the control circuit CC. The switching element SD2 is, for example, a power MOS transistor having a planar gate structure. The semiconductor device 5 is, for example, a hybrid device including the switching element SD2 and a control chip including the control circuit CC.

The switching element SD2 includes, for example, the semiconductor portion 10, a third electrode (hereinafter, referred to as the gate electrode 40), and a fourth electrode (hereinafter, referred to as the field plate 50). In the following description, a source electrode is the source S, a drain electrode is the drain D, a gate terminal is the gate G, and a field plate terminal is an FP terminal.

As shown in FIG. 17, the semiconductor portion 10 includes the n-type drift layer 11, the p-type body layer 13, the n-type source layer 15, the p-type contact layer 17, the n-type buffer layer 19, a p-type well 25, and an n-type contact layer 26.

The p-type well 25 contains a p-type impurity having a concentration lower than a concentration of a p-type impurity of the p-type body layer 13. The n-type drift layer 11 and the p-type body layer 13 are arranged on the p-type well 25. The n-type drift layer 11 and the p-type body layer 13 are arranged in a direction along the surface of the semiconductor portion 10, for example, in the X-direction. The n-type buffer layer 19 is partially provided on the n-type drift layer 11. The n-type contact layer 26 is provided on the n-type buffer layer 19. The n-type contact layer 26 contains an n-type impurity having a concentration higher than a concentration of an n-type impurity in the n-type buffer layer 19.

The n-type source layer 15 and the p-type contact layer 17 are arranged, for example, in the X-direction on the p-type body layer 13. The n-type source layer 15 is located, for example, between the n-type drift layer 11 and the p-type contact layer 17. The p-type body layer 13 extends between the n-type drift layer 11 and the n-type source layer 15.

A thickness of the n-type drift layer 11 in the Z-direction is, for example, larger than a thickness of the p-type body layer 13 in the Z-direction. Shallow trench isolation (STI) is partially provided on the n-type drift layer 11 on the surface side of the semiconductor portion 10. The STI is provided between a portion of the n-type drift layer 11 facing the p-type body layer 13 and the n-type contact layer 26.

The gate electrode 40 is provided on the surface of the semiconductor portion 10 via the gate insulating film 43. The gate electrode 40 faces the p-type body layer 13 between the n-type drift layer 11 and the n-type source layer 15 via the gate insulating film 43. The field plate 50 is provided on the surface of the semiconductor portion 10 via the FP insulating film 53. The field plate 50 faces the n-type drift layer 11 via the FP insulating film 53. The gate electrode 40 and the field plate 50 are provided adjacent to each other, and are separated from each other. The field plate 50 extends on the STI.

The switching element SD2 further includes the interlayer insulating film 45. The interlayer insulating film 45 is provided on the surface side of the semiconductor portion 10 and covers the gate electrode 40 and the field plate 50. The source S, the drain D, the gate G, and the FP terminal are provided on the interlayer insulating film 45.

The drain D is connected to the n-type contact layer 26 through a contact hole formed in the interlayer insulating film 45. The source S is connected to the n-type source layer 15 and the p-type contact layer 17 through another contact hole formed in the interlayer insulating film 45. The gate G and the FP terminal are respectively connected to the gate electrode 40 and the field plate 50 through another contact hole formed in the interlayer insulating film 45.

The drain D is connected to the first terminal DT. The source S is connected to the second terminal ST. The gate G is connected to the control terminal GT.

The control circuit CC includes the capacitor CB, the first transistor Tr1, the second transistor Tr2, and the third transistor Tr3, and has a configuration same as that of the control circuit CC shown in FIG. 2. The FP terminal of the switching element SD2 is connected to the drain of the first transistor Tr1 and the drain of the second transistor Tr2. The control terminal GT is also connected to the gate of the third transistor Tr3.

Fourth Embodiment

Figure 18:
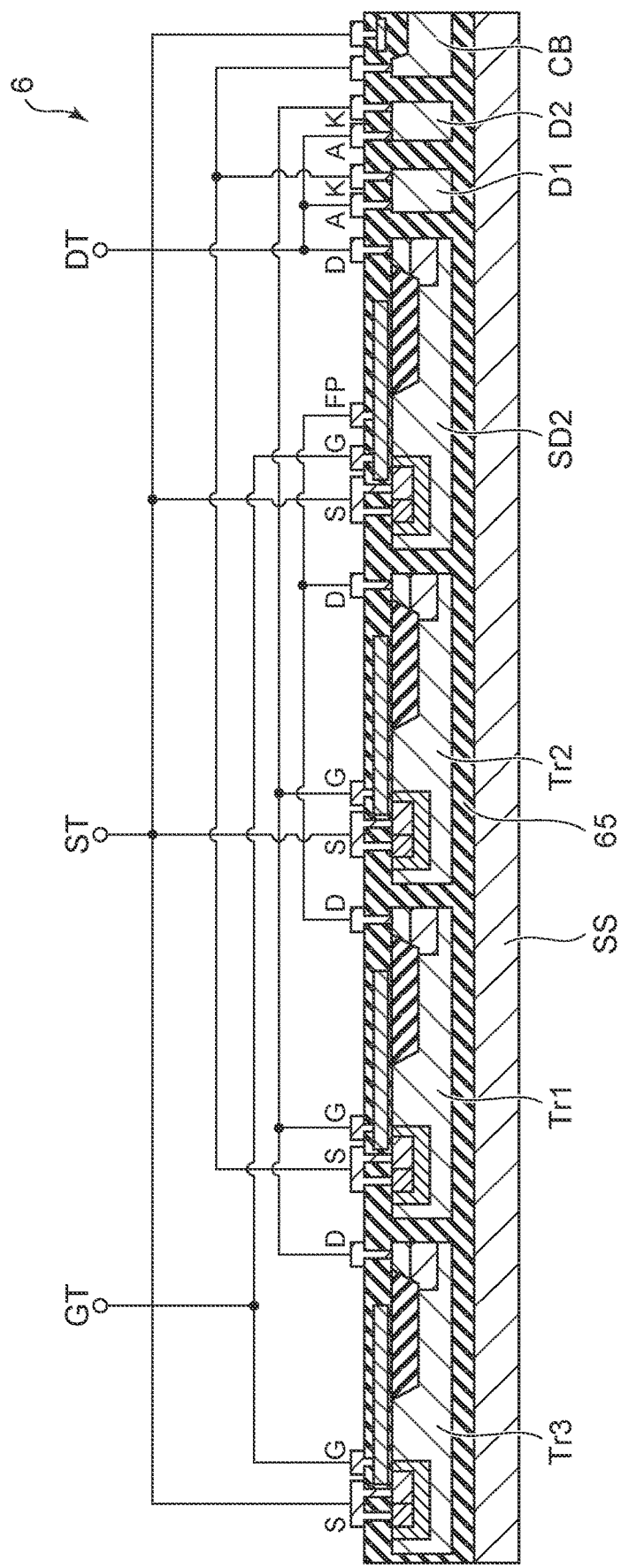
FIG. 18 is a schematic view showing a semiconductor device according to a fourth embodiment.

FIG. 18 is a schematic view showing a semiconductor device 6 according to a fourth embodiment. The semiconductor device 6 includes the switching element SD2 (see FIG. 17), the first transistor Tr1, the second transistor Tr2, the third transistor Tr3, the first diode D1, the second diode D2, and the capacitor CB, which are monolithically integrated. Each element has, for example, a silicon on insulator (SOI) structure provided on a semiconductor substrate SS via an insulating layer 65. The first transistor Tr1 to the third transistor Tr3 are, for example, MOS transistors having a planar gate structure.

The drain D of the switching element SD2 is connected to the first terminal DT. An anode A of the first diode D1 and the anode of the second diode D2 are also connected to the first terminal DT.

The sources S of the switching element SD2, the second transistor Tr2, and the third transistor Tr3 are connected to the second terminal ST. One terminal CBS (see FIG. 2) of the capacitor CB is also connected to the second terminal ST.

The source S of the first transistor Tr1 is connected to the cathode of the first diode D1 and the other terminal CBD of the capacitor CB (see FIG. 2). The drain D of the first transistor Tr1 is connected to the drain D of the second transistor Tr2 and the FP terminal of the switching element SD2.

The gate G of the switching element SD2 is connected to the control terminal GT. The gate G of the first transistor Tr1 and the gate G of the second transistor Tr2 are connected to the drain D of the third transistor Tr3 and a cathode K of the second diode D2. The gate G of the third transistor Tr3 is connected to the control terminal GT.

In the semiconductor devices 5 and 6 according to the embodiments, the switching element SD2 is also operated by the control method shown in FIG. 2, and the on-resistance and the switching loss can also be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Additionally, the embodiments described above can be combined mutually.

Embodiments include the following aspects.

Note 1

A control circuit comprising:
a first bias terminal;
a second bias terminal separated from the first bias terminal;
an input-side terminal separated from the first bias terminal and the second bias terminal;
a diode having an anode connected to the first bias terminal;
a capacitor including a first terminal connected to a cathode of the diode and a second terminal electrically connected to the second bias terminal;
a first transistor including a third terminal connected to the first terminal of the capacitor, a fourth terminal, and a first control terminal configured to turn on and off electrical conduction between the third terminal and the fourth terminal; a second transistor including a fifth terminal connected to the fourth terminal of the first transistor, a sixth terminal connected to the second bias terminal, and a second control terminal configured to turn on and off electrical conduction between the fifth terminal and the sixth terminal; and an output-side terminal separated from the first bias terminal, the second bias terminal, and the input-side terminal and connected to the fourth terminal of the first transistor and the fifth terminal of the second transistor, a control signal based on a signal input to the input-side terminal being input to the first control terminal and the second control terminal, and the first transistor and the second transistor being alternately turned on and alternately turned off.

Note 2

The circuit according to note 1, further comprising:
a second output-side terminal separated from the first bias terminal, the second bias terminal, the input-side terminal, and the output-side terminal and configured to directly output a signal input to the input-side terminal.

Note 3

The circuit according to claim 1 or 2, wherein
the fourth terminal is a drain-side terminal of the first transistor, and the fifth terminal is a drain-side terminal of the second transistor.

Note 4

The circuit according to any one of notes 1 to 3, further comprising:
- a second diode having an anode connected to the first bias terminal; and
- a third transistor including a seventh terminal connected to a cathode of the second diode, an eighth terminal connected to the second bias terminal, and a third control terminal configured to turn on and off electrical conduction between the seventh terminal and the eighth terminal,
- the first control terminal of the first transistor and the second control terminal of the second transistor being connected to the seventh terminal of the third transistor, and
- the third control terminal of the third transistor being connected to the input-side terminal.

Note 5

The circuit according to any one of notes 1 to 3, further comprising:
- a third transistor including a seventh terminal connected to the first bias terminal via a resistor, an eighth terminal connected to the second bias terminal, and a third control terminal configured to turn on and off electrical conduction between the seventh terminal and the eighth terminal,
- the first control terminal of the first transistor and the second control terminal of the second transistor being connected to the seventh terminal of the third transistor, and
- the third control terminal of the third transistor being connected to the input-side terminal.

Note 6

A semiconductor device comprising:
the control circuit according to any one of notes 1 to 5; and
a switching element connected to the control circuit, the switching element including a first electrode connected to the first bias terminal of the control circuit, a second electrode connected to the second bias terminal of the control circuit, a third electrode connected to the output-side terminal of the control circuit, a control electrode connected to the input-side terminal of the control circuit, and a semiconductor portion electrically connected to the first electrode and the second electrode, the control electrode being configured to turn on and off electrical conduction in the semiconductor portion between the first electrode and the second electrode according to the signal input to the input-side terminal, and
the third electrode being provided between the first electrode and the second electrode, and facing the semiconductor portion via an insulating film.

Note 7

The device according to note 6, wherein
the capacitor of the control circuit has a capacitance value larger than a parasitic capacitance between the third electrode and the first electrode.

Note 8

The device according to note 7, wherein
the capacitor of the control circuit is integrated on the semiconductor portion.

Note 9

The device according to any one of notes 6 to 8, wherein
the control circuit is integrated on the semiconductor portion.

Note 10

The device according to any one of notes 6 to 8, wherein
the control circuit is configured to increase a potential of the third electrode after the switching element is in an on-state.

What is claimed is:
1. A control circuit comprising:
a first bias terminal;
a second bias terminal separated from the first bias terminal;
an input-side terminal separated from the first bias terminal and the second bias terminal;
a diode having an anode connected to the first bias terminal;
a capacitor including a first terminal connected to a cathode of the diode and a second terminal electrically connected to the second bias terminal;
a first transistor including a third terminal connected to the first terminal of the capacitor, a fourth terminal, and a first control terminal configured to turn on and off electrical conduction between the third terminal and the fourth terminal;
a second transistor including a fifth terminal connected to the fourth terminal of the first transistor, a sixth terminal connected to the second bias terminal, and a second control terminal configured to turn on and off electrical conduction between the fifth terminal and the sixth terminal;
a first output-side terminal separated from the first bias terminal, the second bias terminal, and the input-side terminal and connected to the fourth terminal of the first transistor and the fifth terminal of the second transistor; and
a second output-side terminal,
a control signal based on a signal input to the input-side terminal being input to the first control terminal and the second control terminal, and the first transistor and the second transistor being alternately turned on and off, and the second output-side terminal being separated from the first bias terminal, the second bias terminal, the input-side terminal, and the first output-side terminal and directly outputting a signal input to the input-side terminal.

2. The circuit according to claim 1, wherein the fourth terminal is a drain-side terminal of the first transistor, and the fifth terminal is a drain-side terminal of the second transistor.

3. The circuit according to claim 1, further comprising:
a second diode having an anode connected to the first bias terminal; and
a third transistor including a seventh terminal connected to a cathode of the second diode, an eighth terminal connected to the second bias terminal, and a third control terminal configured to turn on and off electrical conduction between the seventh terminal and the eighth terminal,
the first control terminal of the first transistor and the second control terminal of the second transistor being connected to the seventh terminal of the third transistor, and
the third control terminal of the third transistor being connected to the input-side terminal.

4. The circuit according to claim 1, further comprising:
a third transistor including a seventh terminal connected to the first bias terminal via a resistor, an eighth terminal connected to the second bias terminal, and a third control terminal configured to turn on and off electrical conduction between the seventh terminal and the eighth terminal,
the first control terminal of the first transistor and the second control terminal of the second transistor being connected to the seventh terminal of the third transistor, and
the third control terminal of the third transistor being connected to the input-side terminal.

5. A semiconductor device comprising:
a control circuit; and
a switching element connected to the control circuit, the control circuit comprising:
  a first bias terminal,
  a second bias terminal separated from the first bias terminal,
  an input-side terminal separated from the first bias terminal and the second bias terminal,
  a diode having an anode connected to the first bias terminal,
  a capacitor including a first terminal connected to a cathode of the diode and a second terminal electrically connected to the second bias terminal,
  a first transistor including a third terminal connected to the first terminal of the capacitor, a fourth terminal, and a first control terminal configured to turn on and off electrical conduction between the third terminal and the fourth terminal,
  a second transistor including a fifth terminal connected to the fourth terminal of the first transistor, a sixth terminal connected to the second bias terminal, and a second control terminal configured to turn on and off electrical conduction between the fifth terminal and the sixth terminal, and
  an output-side terminal separated from the first bias terminal, the second bias terminal, and the input-side terminal and connected to the fourth terminal of the first transistor and the fifth terminal of the second transistor,
  a control signal based on a signal input to the input-side terminal being input to the first control terminal and the second control terminal, and the first transistor and the second transistor being alternately turned on and off,
the switching element including a first electrode connected to the first bias terminal of the control circuit, a second electrode connected to the second bias terminal of the control circuit, a third electrode connected to the output-side terminal of the control circuit, a control electrode connected to the input side input-side terminal of the control circuit, and a semiconductor portion electrically connected to the first electrode and the second electrode,
the control electrode being configured to turn on and off electrical conduction in the semiconductor portion between the first electrode and the second electrode according to the signal input to the input side input-side terminal, and
the third electrode being provided between the first electrode and the second electrode, and facing the semiconductor portion via an insulating film.

6. The device according to claim 5, wherein the capacitor of the control circuit has a capacitance value larger than a parasitic capacitance between the third electrode and the first electrode.

7. The device according to claim 6, wherein the capacitor of the control circuit is integrated on the semiconductor portion.

8. The device according to claim 6, wherein the control circuit is integrated on the semiconductor portion.

9. The device according to claim 5, wherein the control circuit is configured to increase a potential of the third electrode after the switching element is in an on-state.

* * * * *